(12) United States Patent
Chang et al.

(10) Patent No.: US 12,382,666 B2
(45) Date of Patent: Aug. 5, 2025

(54) ENLARGEMENT OF GAA NANOSTRUCTURE

(71) Applicant: Taiwan Semiconductor Manufacturing Co., Ltd., Hsinchu (TW)

(72) Inventors: Lo-Heng Chang, Hsinchu (TW); Jung-Hung Chang, Changhua County (TW); Zhi-Chang Lin, Zhubei (TW); Kuo-Cheng Chiang, Zhubei (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/843,332

(22) Filed: Jun. 17, 2022

(65) Prior Publication Data

US 2022/0320348 A1    Oct. 6, 2022

Related U.S. Application Data

(62) Division of application No. 16/898,717, filed on Jun. 11, 2020, now Pat. No. 11,417,777.

(51) Int. Cl.
| | | |
|---|---|---|
| H10D 30/67 | (2025.01) | |
| H01L 21/02 | (2006.01) | |
| H01L 21/3065 | (2006.01) | |
| H01L 21/311 | (2006.01) | |
| H10D 30/01 | (2025.01) | |
| H10D 62/10 | (2025.01) | |
| H10D 64/01 | (2025.01) | |

(52) U.S. Cl.
CPC ... *H10D 30/6757* (2025.01); *H01L 21/02603* (2013.01); *H01L 21/3065* (2013.01); *H01L 21/31111* (2013.01); *H10D 30/031* (2025.01); *H10D 30/6713* (2025.01); *H10D 30/6735* (2025.01); *H10D 62/121* (2025.01); *H10D 64/017* (2025.01)

(58) Field of Classification Search
CPC .......... H01L 29/0673; H01L 29/66545; H01L 29/66553; H01L 29/66795; H01L 29/78696
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Brian Turner
(74) *Attorney, Agent, or Firm* — Slater Matsil, LLP

(57) ABSTRACT

A method of forming a semiconductor device includes forming a fin of alternating layers of semiconductor nanostructures and sacrificial layers, laterally etching sidewall portions of the sacrificial layers, and depositing additional semiconductor material over the sidewalls of the semiconductor nanostructures and sacrificial layers. Following deposition of a dielectric material over the additional semiconductor material and additional etching, the remaining portions of the semiconductor structures and additional semiconductor material collectively form a hammer shape at each opposing side of the fin. Epitaxial source/drain regions formed on the opposing sides of the fin will contact the heads of the hammer shapes.

20 Claims, 29 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2015/0270340 A1 | 9/2015 | Frank et al. | |
| 2015/0340490 A1 | 11/2015 | An et al. | |
| 2016/0233317 A1* | 8/2016 | Yin | H10D 62/121 |
| 2017/0140996 A1* | 5/2017 | Lin | H10D 64/017 |
| 2017/0213911 A1 | 7/2017 | Balakrishnan et al. | |
| 2017/0221893 A1 | 8/2017 | Tak et al. | |
| 2018/0219064 A1* | 8/2018 | Cheng | H01L 29/0649 |
| 2018/0277656 A1* | 9/2018 | Chao | H01L 21/02247 |
| 2019/0058052 A1 | 2/2019 | Frougier et al. | |
| 2019/0371888 A1* | 12/2019 | Zhang | H01L 21/02532 |
| 2020/0091149 A1* | 3/2020 | Lee | B82Y 10/00 |
| 2020/0168703 A1 | 5/2020 | Rachmady et al. | |
| 2020/0251593 A1 | 8/2020 | Miao et al. | |
| 2020/0266060 A1 | 8/2020 | Cheng et al. | |
| 2020/0286992 A1* | 9/2020 | Song | H01L 29/0673 |
| 2020/0287046 A1 | 9/2020 | Frougier et al. | |
| 2020/0295198 A1 | 9/2020 | Cheng et al. | |
| 2021/0134677 A1* | 5/2021 | Pan | H01L 21/76205 |

\* cited by examiner

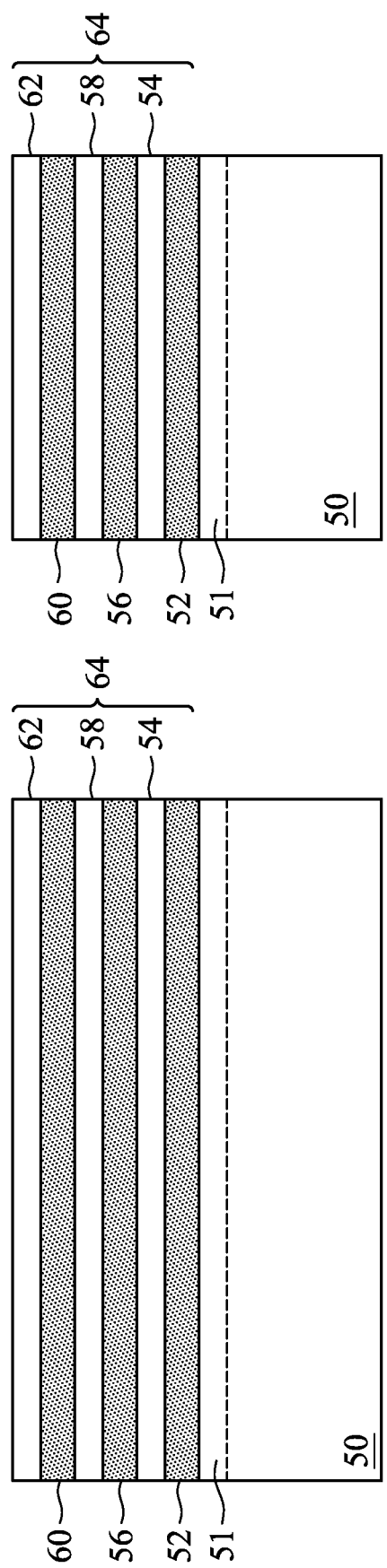

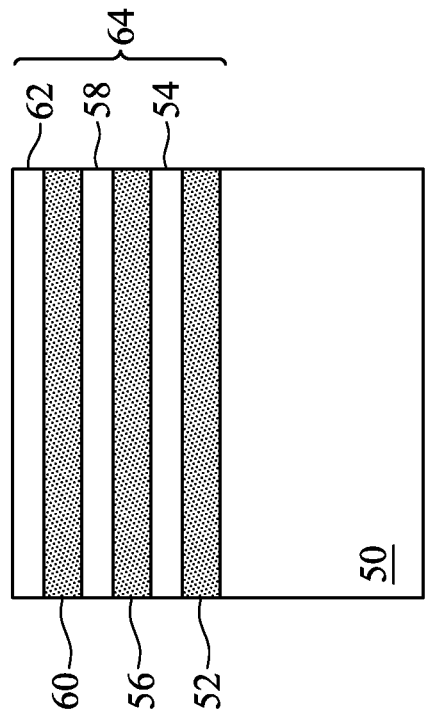
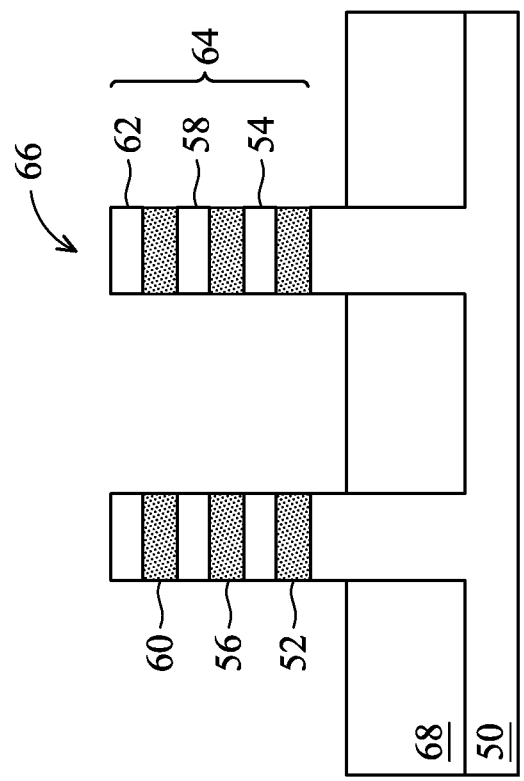
Figure 4B
Figure 4A

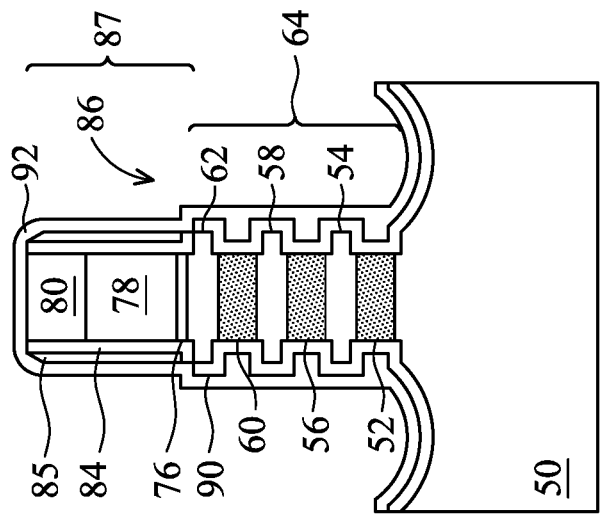
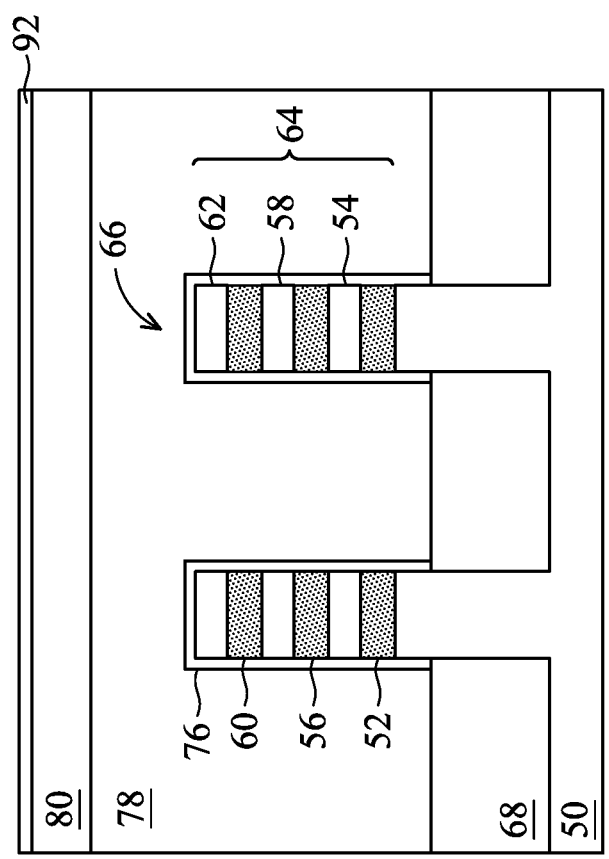
Figure 12B
Figure 12A

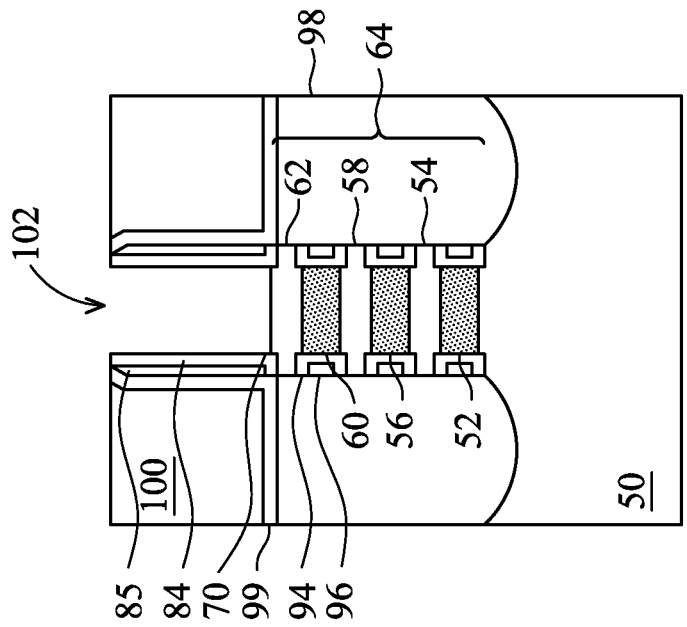
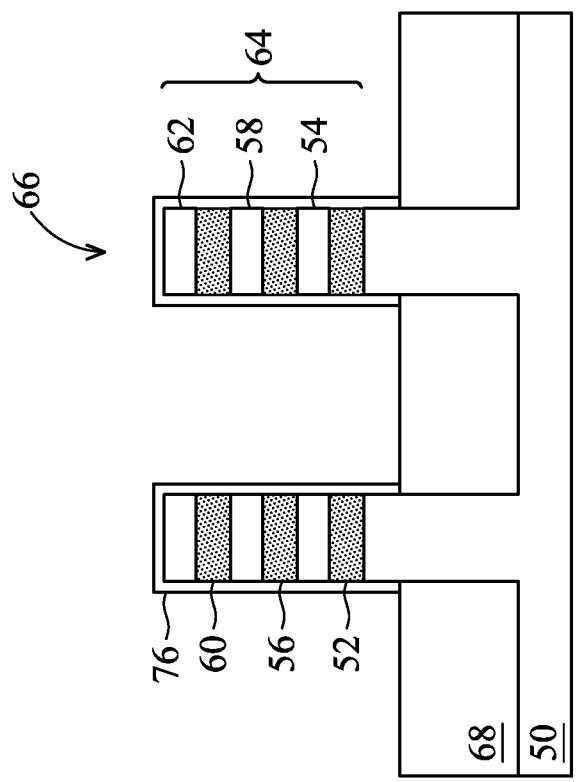
Figure 17B
Figure 17A

ENLARGEMENT OF GAA NANOSTRUCTURE

PRIORITY CLAIM AND CROSS-REFERENCE

This application is a division of U.S. patent application Ser. No. 16/898,717, filed on Jun. 11, 2020, entitled "Enlargement of GAA Nanostructure," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-22B are cross-sectional views of intermediate stages during the manufacture of a semiconductor device, in accordance with some embodiments.

DETAILED DESCRIPTION

Figure 1:
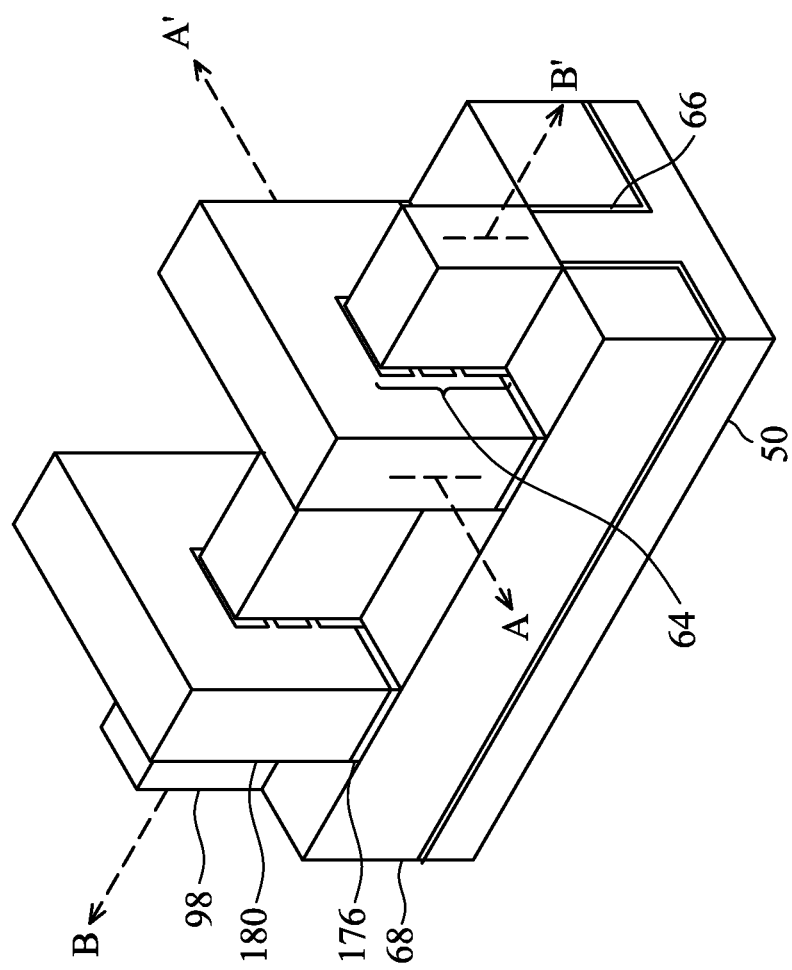
FIG. 1 is a schematic perspective view of an intermediate stage during the manufacture of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having more efficient growth of source and drain regions, source and drain regions having fewer defects, lower electrical resistance and higher current into the channel regions, and reduced current crowding at the interfaces between source/drain regions and the channel regions. The semiconductor devices may be nanostructure field-effect transistors (nano-FETs, also referred to as nanosheet field-effect transistors (NSFETs), nanowire field-effect transistors (NWFETs), or gate-all-around field-effect transistors (GAAFETs)). Inner spacers are provided in regions between stacked semiconductor layers used to form channel regions in the nano-FETs. Additional semiconductor regions may be formed on each of the semiconductor layers before the inner spacers are formed. Source and drain regions will form adjacent to the semiconductor regions and semiconductor layers with greater ease and fewer defects. In addition, the source and drain regions will have more surface area of physical contact with the semiconductor regions and semiconductor layers to improve current flow and reduce current crowding effects.

The formation of inner spacers between channel regions of a nano-FET often begins with a lateral etch to create the recesses within which the inner spacers will ultimately be formed. Without perfect precision, the lateral etch may remove portions of other features important to the nano-FET, such as portions of the channel regions near the subsequently formed source/drain regions. At least three key benefits result from (A) forming a layer of semiconductor material over those recess, (B) forming an inner spacer layer over that layer of semiconductor material, and (C) etching both layers to form distinct inner spacers being substantially level with the semiconductor material. First, the semiconductor material comprises a greater amount of surface area along the level sidewall of both layers, which is important because epitaxial growth of the source and drain regions is facilitated more by the semiconductor material than the inner spacer material. Second, this greater amount of surface area between the semiconductor material and the epitaxial source and drain regions also allows for the nanostructures (serving as channel regions) to be closer to one another without unwanted cross interference. Third, the subsequently formed channel region will have regained semiconductor material to account for any inadvertently etched portions during the lateral etch, which improves current flow and lowers the resistance between the source and drain regions and through the channel region by providing more surface area between each source/drain region and the channel region.

The channel region may have an I-shape (with "serifs"), or an I-beam shape, or a hammer shape on each end proximal to the source/drain regions. The serifs on each end of the I-shape or each end of the double-hammer provide greater surface area to achieve the above-described benefits. When source/drain regions are epitaxially grown, they will typically grow most effectively over the semiconductor materials of the semiconductor substrate and the channel regions. As such, the greater surface area along the sides of the stacked channel regions in a nano-FET, for example, facilitates a faster initiation of the growth process, quicker growth, and more robust formation as the distinct growth regions begin to expand into one another. Indeed, the epitaxial growth is improved in a multitude of ways with sufficient surface area. The more robust formation essentially means that the resulting source/drain regions will be more uniform and contain fewer defects.

The greater surface area on each end of the channel regions further ensures a robust connection with the source/drain regions. The greater surface area increases current flow into and out of the channel regions, lowers resistance of the current flow across the material boundaries, and minimizes any negative effects (e.g., current crowding, short channel effects) that may occur from defects near those material boundaries by providing plenty of alternative paths for the current to cross the material boundaries. Indeed, the resulting nano-FET may have a saturation current or $I_{on}$ gain of about 5% to about 10%.

FIG. 1 illustrates an example of nano-FETs in a three-dimensional view, in accordance with some embodiments. The nano-FETs comprise channel regions 55 over fins 66 on a substrate 50 (e.g., a semiconductor substrate). STI regions 68 are disposed in the substrate 50, and the fins 66 protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although the fins 66 are illustrated as being single, continuous materials with the substrate 50, the fins 66 and/or the substrate 50 may comprise single materials or a plurality of materials. In this context, the fins 66 refer to the portion extending between the neighboring STI regions 68.

Gate dielectric layers 176 are along sidewalls and over top surfaces of the fins 66 and along top surfaces, sidewalls, and bottom surfaces of the channel regions 55. Gate electrodes 180 are over the gate dielectric layers 176. Epitaxial source/drain regions 98 are disposed on opposite sides of the fins 66 and interposed by channel regions of multi-layer gate stacks 64. FIG. 1 further illustrates reference cross-sections that are used in later figures. Cross-section A-A' is along a longitudinal axis of a gate electrode 180 and in a direction, for example, perpendicular to the direction of current flow between the epitaxial source/drain regions 98 of a nano-FET. Cross-section B-B' is perpendicular to cross-section A-A' and is along a longitudinal axis of a fin 66 of the nano-FET and in the direction of, for example, the current flow between the epitaxial source/drain regions 98 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2A through 22B are cross-sectional views of intermediate stages in the manufacturing of nano-FETs, in accordance with some embodiments. Specifically, FIGS. 2A, 3A, 4A, 5A, 6A, 7A, 8A, 9A, 10A, 11A, 12A, 13A, 14A, 15A, 16A, 17A, 18A, 19A, 20A, 21A, and 22A illustrate reference cross-section A-A' illustrated in FIG. 1. In addition, FIGS. 2B, 3B, 4B, 5B, 6B, 7B, 8B, 9B, 10B, 10C, 10D, 10E, 11B, 11C, 12B, 12C, 13B, 13C, 14B, 14C, 14D, 14E, 15B, 16B, 17B, 18B, 19B, 19C, 20B, 21B, and 22B illustrate reference cross-sections B-B' illustrated in FIG. 1.

In FIGS. 2A and 2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may be lightly doped with a p-type or an n-type impurity. An anti-punch-through (APT) implantation may be performed on an upper portion of the substrate 50 to form an APT region 51. The dopants may have a conductivity type opposite a conductivity type of source/drain regions in the resulting nano-FETS, which will be formed in subsequent steps. The APT region 51 may extend under the subsequently formed source/drain regions. The APT region 51 may be used to reduce the leakage from the source/drain regions to the substrate 50. In some embodiments, the doping concentration in APT region 51 may be from about $1 \times 10^{18}$ atoms/cm$^3$ to about $1 \times 10^{19}$ atoms/cm$^3$. For simplicity and legibility, the APT region 51 is not illustrated in subsequent figures.

Further in FIGS. 2A and 2B, a multi-layer stack 64 is formed over the substrate 50. The multi-layer stack 64 includes first semiconductor layers and second semiconductor layers. The first semiconductor layers may include a first channel layer 54, a second channel layer 58, and a third channel layer 62. The second semiconductor layers may include a first sacrificial layer 52, a second sacrificial layer 56, and a third sacrificial layer 60. However, in other embodiments, the multi-layer stack 64 may include any number of channel layers and sacrificial layers. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, alternating layers of the multi-layer stack 64 may be formed of first semiconductor materials (e.g., silicon (Si), silicon carbon (SiC), or the like) or second semiconductor materials (e.g., silicon germanium (SiGe) or the like). For example, the first sacrificial layer 52, the second sacrificial layer 56, and the third sacrificial layer 60 may be formed of the second semiconductor material, and the first channel layer 54, the second channel layer 58, and the third channel layer 62 may be formed of the first semiconductor material. In other embodiments, the first sacrificial layer 52, the second sacrificial layer 56, and the third sacrificial layer 60 may be formed of the first semiconductor material, and the first channel layer 54, the second channel layer 58, and the third channel layer 62 may be formed of the second semiconductor material. The first semiconductor materials and the second semiconductor materials may be materials having high etch selectivity to one another. As such, the layers of the multi-layer stack 64 including the first semiconductor material may be removed without removing the layers including the second semiconductor material and the layers of the multi-layer stack 64 including the second semiconductor material may be removed without removing the layers including the first semiconductor material.

As illustrated in FIGS. 2A and 2B, the channel layers (e.g., the first channel layer 54, the second channel layer 58, and the third channel layer 62) may have thicknesses greater than or equal to the sacrificial layers (e.g., the first sacrificial layer 52, the second sacrificial layer 56, and the third sacrificial layer 60). For example, each of the sacrificial layers may have a thickness from about 5 nm to about 11 nm, such as about 6 nm. Each of the channel layers may have a thickness from about 7 nm to about 12 nm, such as about 9 nm. A ratio of the thickness of one of the sacrificial layers to the thickness of one of the channel layers may be from about 1 to about 2. As will be discussed in greater detail below, including the channel layers and the sacrificial layers with the prescribed thicknesses allows for a high-k dielectric (such as the gate dielectric layer 176, discussed below with respect to FIGS. 19A-21B) to fill gaps left by removing the sacrificial layers and allows for both the high-k dielectric and a gate electrode (such as the gate electrode 180, discussed below with respect to FIGS. 20A-21B) to fill gaps left by removing the channel layers. The high-k dielectric is used to isolate subsequently formed source/drain regions (such as the epitaxial source/drain regions 98, discussed below with respect to FIGS. 13A-13E) and the channel layers from the substrate 50, which reduces leakage, prevents latch-up, improves performance, and reduces defects in the subsequently completed nano-FET. In addition, each of the channel layers having a thickness of no greater than 8 nm will reduce any short channel effects (e.g., leakage current, drain-induced barrier lowering, impact ionization) in the subsequently completed nano-FET.

Figure 3B:
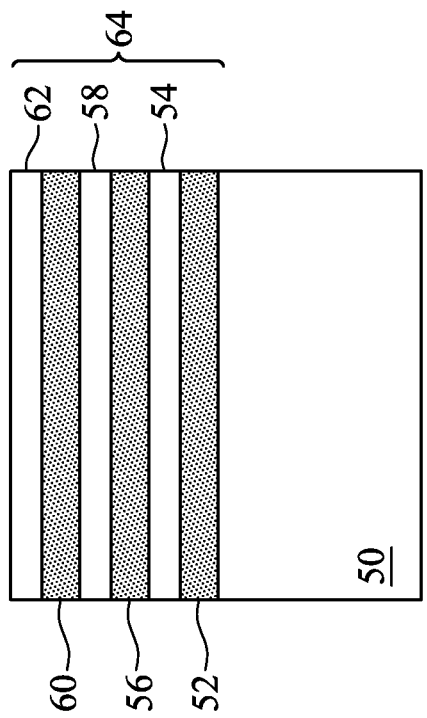
Figure 3A:
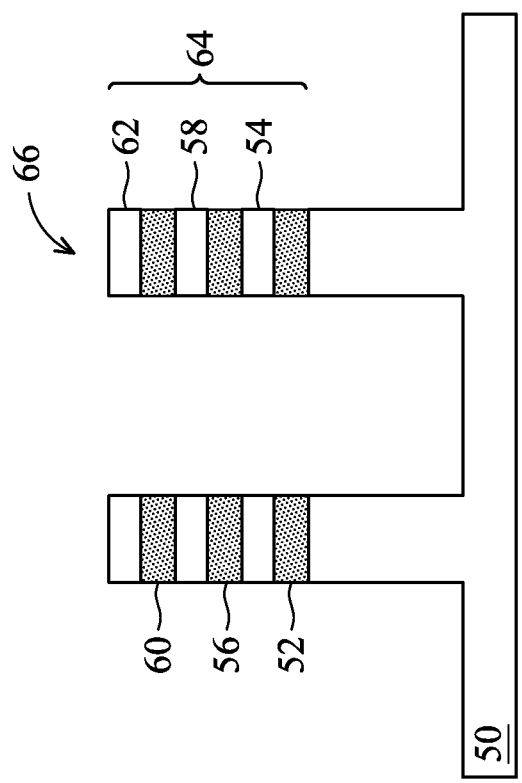

In FIGS. 3A and 3B, fins 66 are formed in the multi-layer stack 64 and the substrate 50. The fins 66 may be semiconductor strips. In some embodiments, the fins 66 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The fins 66 may be patterned by any suitable method. For example, the fins 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not illustrated) is formed over a substrate and patterned using a photolithography process. Spacers (not illustrated) are formed alongside the patterned sacrificial layer using a self-aligned process. The sacrificial layer is then removed, and the remaining spacers may then be used to pattern the fins 66.

In FIGS. 4A and 4B, shallow trench isolation (STI) regions 68 are formed adjacent to the fins 66. The STI regions 68 may be formed by depositing an insulation material over the substrate 50 and the fins 66 and between the fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used.

In some embodiments, the insulation material is silicon oxide formed by an FCVD process. An anneal process may be performed once the insulation material is formed. The insulation material may be formed such that excess insulation material covers the fins 66. Although the insulation material is illustrated as a single layer, some embodiments may utilize multiple layers. For example, in some embodiments a liner (not separately illustrated) may first be formed along a surface of the substrate 50 and the fins 66. Thereafter, a filler material, such as those discussed above may be formed over the liner.

A removal process is then applied to the insulation material to remove excess insulation material over the fins 66. In some embodiments, a planarization process such as a chemical mechanical polish (CMP), an etch-back process, combinations thereof, or the like may be utilized. The planarization process exposes the fins 66 such that top surfaces of the fins 66 and the insulation material are level after the planarization process is complete.

The insulation material is then recessed to form the STI regions 68. The insulation material is recessed such that upper portions of fins 66 protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66). For example, an oxide removal using, for example, dilute hydrofluoric (dHF) acid may be used.

The process described with respect to FIGS. 2A through 4B is just one example of how the fins 66 may be formed. In some embodiments, the fins 66 may be formed by an epitaxial growth process. For example, a dielectric layer can be formed over a top surface of the substrate 50, and trenches can be etched through the dielectric layer to expose the underlying substrate 50. Epitaxial structures (e.g., the layers of the multi-layer stack 64) may be epitaxially grown in the trenches, and the dielectric layer may be recessed such that the epitaxial structures protrude from the dielectric layer to form the fins 66. The epitaxial structures may comprise the semiconductor materials discussed above, such as the first semiconductor materials and the second semiconductor materials that form the layers of the multi-layer stack 64. In some embodiments where the epitaxial structures are epitaxially grown, the epitaxially grown materials may be in situ doped during growth, which may obviate prior and subsequent implantations although in situ and implantation doping may be used together.

Further in FIGS. 4A and 4B, appropriate wells (not separately illustrated) may be formed in the fins 66 and/or the substrate 50. In some embodiments, P wells may be formed in some regions that may contain n-type devices (e.g., n-type nano-FETs), and N wells may be formed in other regions that may contain p-type devices (e.g., p-type nano-FETs). In embodiments with different well types, different implant steps for the P wells and the N wells may be achieved using a photoresist or other masks (not illustrated). For example, a photoresist may be formed over the fins 66 and the STI regions 68 in the regions of the substrate 50 that will contain the N wells. The photoresist is patterned to expose the region of the substrate 50 that will contain the N wells. The photoresist can be formed by using a spin-on technique and can be patterned using acceptable photolithography techniques. Once the photoresist is patterned, an n-type impurity is implanted into the exposed portions of the substrate 50 and/or the fins 66, and the photoresist may act as a mask to substantially prevent n-type impurities from being implanted into the regions that will contain the P wells. The n-type impurities may be phosphorus, arsenic, antimony, or the like implanted in the region to a concentration of equal to or less than $10^{18}$ atoms/cm$^3$, such as from about $10^{16}$ atoms/cm$^3$ to about $10^{18}$ atoms/cm$^3$. After the implant, the photoresist is removed, such as by an acceptable ashing process.

Following the implanting for the N wells, a photoresist (not illustrated) is formed over the fins 66 and the STI regions 68 in the regions containing those N wells. The photoresist is patterned to expose the regions of the substrate 50 that will contain the P wells. The photoresist can be formed by using a spin-on technique and can be patterned using acceptable photolithography techniques. Once the photoresist is patterned, a p-type impurity is implanted into the exposed portions of the substrate 50 and/or the fins 66, and the photoresist may act as a mask to substantially prevent p-type impurities from being implanted into the N wells. The p-type impurities may be boron, boron fluoride, indium, or the like implanted in the region to a concentration of equal to or less than $10^{18}$ atoms/cm$^3$, such as from about $10^{16}$ atoms/cm$^3$ to about $10^{18}$ atoms/cm$^3$. After the implant, the photoresist may be removed, such as by an acceptable ashing process.

After the implants of the regions for the n-type and p-type devices, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5B:
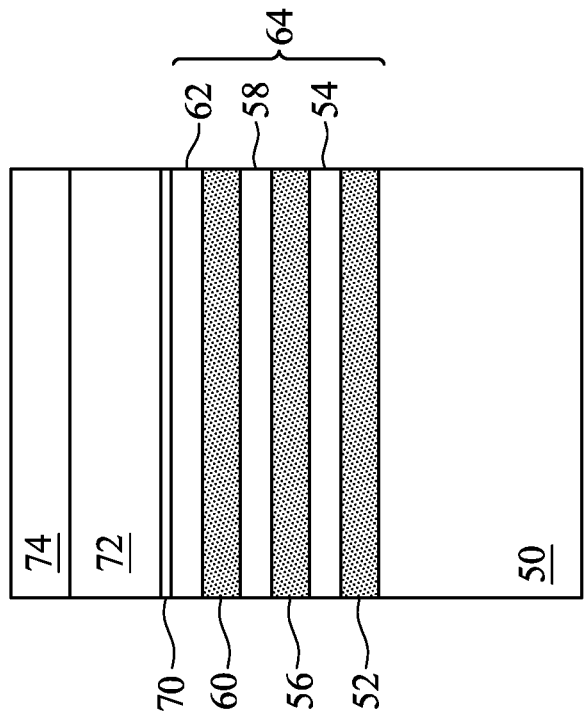
Figure 5A:
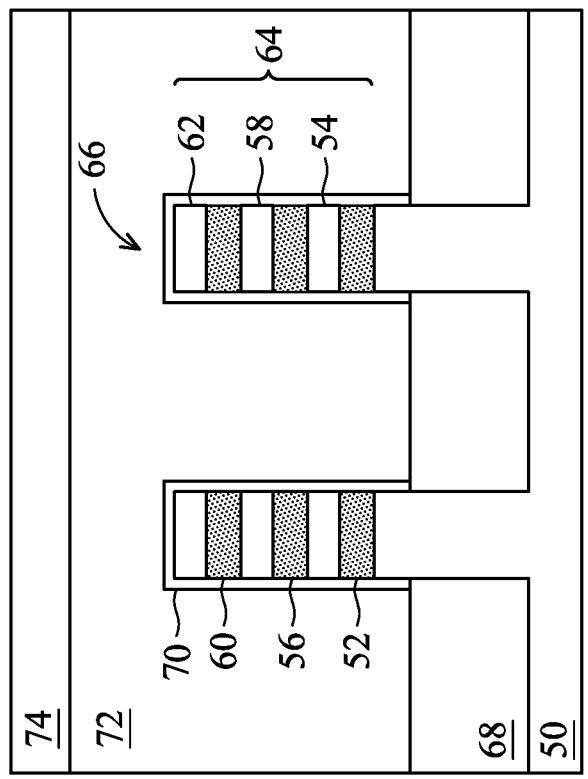

In FIGS. 5A and 5B, a dummy dielectric layer 70 is formed on the fins 66. The dummy dielectric layer 70 may be, for example, silicon oxide, silicon nitride, a combination thereof, or the like, and may be deposited or thermally grown according to acceptable techniques. It is noted that the dummy dielectric layer 70 is shown covering only the fins 66 for illustrative purposes only. For example, a thermally grown dummy dielectric layer 70 may selectively form over the fins 66, particularly the layers of the multi-layer stack 64. Although not specifically illustrated, depending on the materials selected for the sacrificial layers and the channel layers, the dummy dielectric layer 70 may grow at different rates, which may result in wavy sidewalls facing inward to the fins 66 as well as wavy sidewalls facing outward from the fins 66.

In other embodiments, the dummy dielectric layer 70 may be deposited such that the dummy dielectric layer 70 also covers the STI regions 68, extending between the dummy gate layer 72 and the STI regions 68. For example, the dummy dielectric layer 70 may be formed by ALD or chemical deposition, which may result in the dummy dielectric layer 70 being deposited over the STI regions 68 in addition to the fins 66. In such embodiments, the dummy dielectric layer 70 may (or may not) be patterned to substantially remove it from top surfaces of the STI regions 68.

Still referring to FIGS. 5A and 5B, a dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate layer 72 may be formed by physical vapor deposition (PVD), CVD, sputter deposition, or other techniques known and used in the art for forming the selected material. The dummy gate layer 72 may be made of other materials that have a high etching selectivity from the etching of isolation regions. The mask layer 74 may include, for example, silicon nitride, silicon oxynitride, or the like.

Figure 6B:
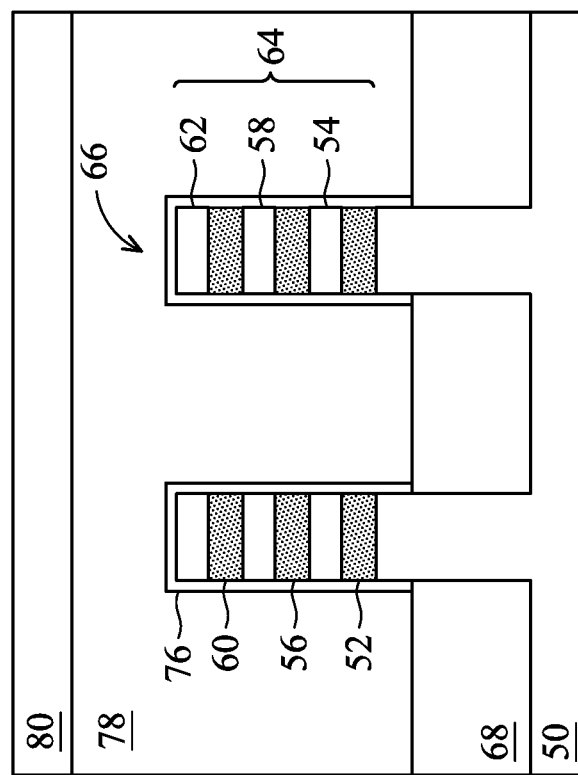
Figure 6A:
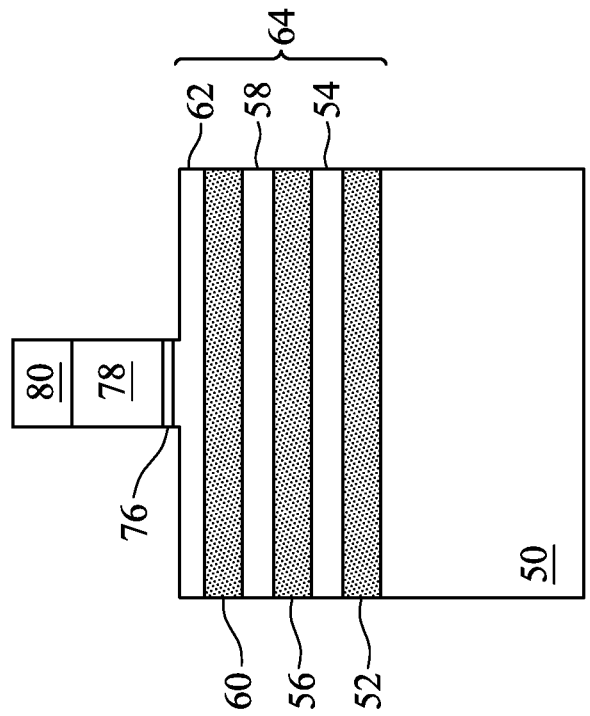

In FIGS. 6A and 6B, the mask layer 74 (see FIGS. 5A and 5B) may be patterned using acceptable photolithography and etching techniques to form mask 80. The pattern of the mask 80 then may be transferred to the dummy gate layer 72 to form dummy gate 78. In some embodiments, the pattern of the mask 80 may also be transferred to the dummy dielectric layer 70 by an acceptable etching technique to form dummy gate dielectric layer 76. In other embodiments, the dummy dielectric layer 70 may remain over an entirety of a top surface of the fins 66. The dummy gates 78 cover respective channel regions of the fins 66. The pattern of the mask 80 may be used to physically separate each of the dummy gates 78 from adjacent dummy gates 78. The dummy gates 78 may also have a lengthwise direction substantially perpendicular to the lengthwise direction of respective fins 66.

Figure 7B:
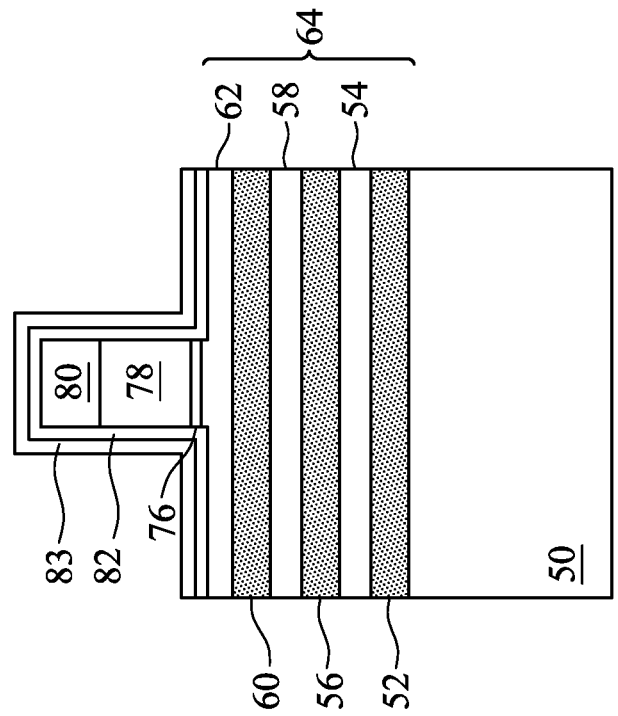
Figure 7A:
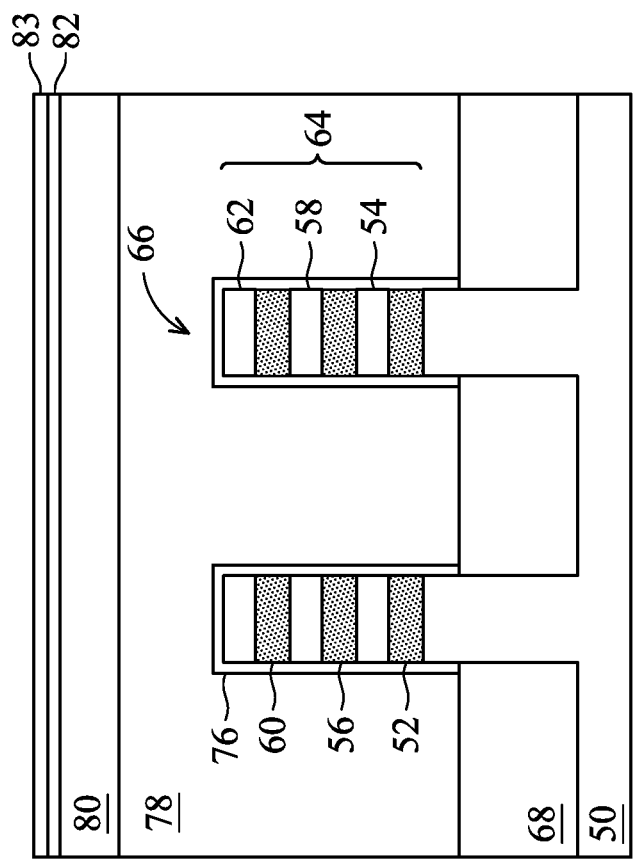

In FIGS. 7A and 7B, gate seal spacer layer 82 are formed on exposed surfaces of the dummy gates 78, the mask 80, and/or the fins 66. The gate seal spacer layer 82 may be formed by a thermal oxidation or a deposition process. The gate seal spacer layer 82 may be formed of silicon oxide, silicon nitride, silicon oxynitride, or the like. Gate spacer layer 83 may then be formed over the gate seal spacer layer 82. The gate spacer layer 83 may be formed by conformally depositing an insulating material over the gate seal spacer layer 82, the mask 80, the dummy gate 78, and the fins 66. The insulating material of the gate spacer layer 83 may be silicon oxide, silicon nitride, silicon oxynitride, silicon carbonitride, a combination thereof, or the like.

Figure 8B:
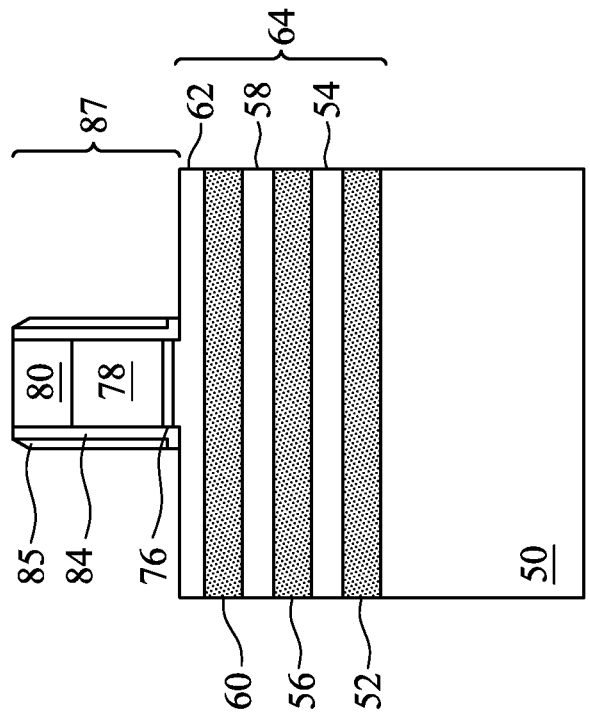
Figure 8A:
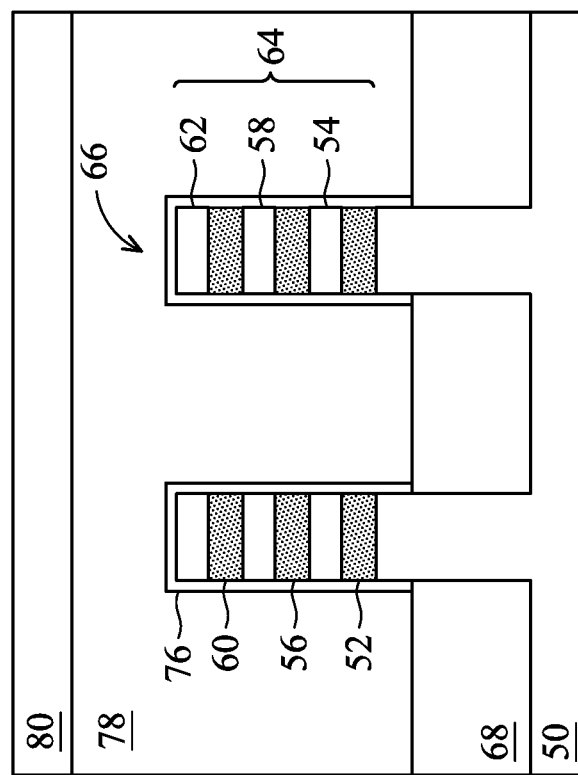

In FIGS. 8A and 8B, the gate seal spacer layer 82 and the gate spacer layer 83 may be anisotropically etched to form gate seal spacers 84 and gate spacers 85. The etching may substantially remove portions of the gate seal spacer layer 82 and the gate spacer layer 83 from top surfaces of the mask 80 and the fins 66, resulting in "L-shaped" gate seal spacers 84 as illustrated in FIG. 8B. The resulting dummy dielectric layer 76, the dummy gate 78, the mask 80, the gate seal spacers 84, and the gate spacers 85, together, comprise a dummy gate structure 87.

After the formation of the gate seal spacers 84 and the gate spacers 85, implants for lightly doped source/drain (LDD) regions (not specifically illustrated) may be performed. In the embodiments with different device types, similar to the implants discussed above in FIGS. 4A and 4B, a mask (also not specifically illustrated), such as a photoresist, may be formed over the regions that will contain the p-type devices, while exposing the regions that will contain the n-type devices, and appropriate type (e.g., n-type) impurities may be implanted into the exposed fins 66 in those regions. The mask may then be removed. Subsequently, a mask, such as a photoresist, may be formed over the regions that will contain the n-type devices while exposing the regions that will contain the p-type devices, and appropriate type (e.g., p-type) impurities may be implanted into the exposed fins 66 in those regions. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the gate seal spacers 84 may be etched prior to forming the gate spacers 85 (resulting in gate seal spacers 84 without the "L-shape" described above), spacers may be formed and removed, and/or the like. Furthermore, the n-type and p-type devices may be formed using different structures and steps. For example, LDD regions for n-type devices may be formed prior to forming the gate seal spacers 84 while the LDD regions for p-type devices may be formed after forming the gate seal spacers 84.

Figure 9B:
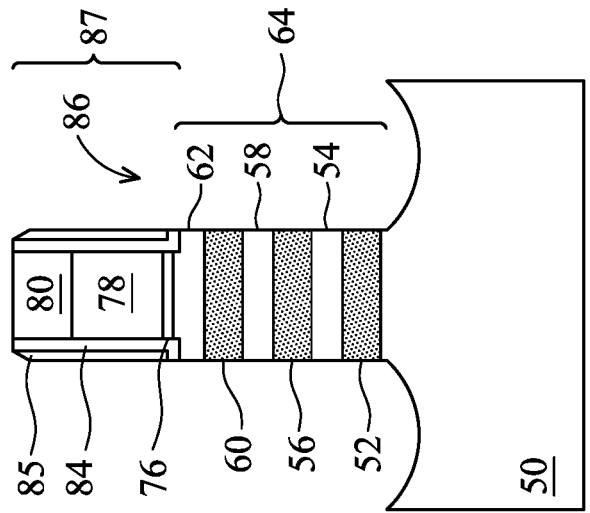
Figure 9A:
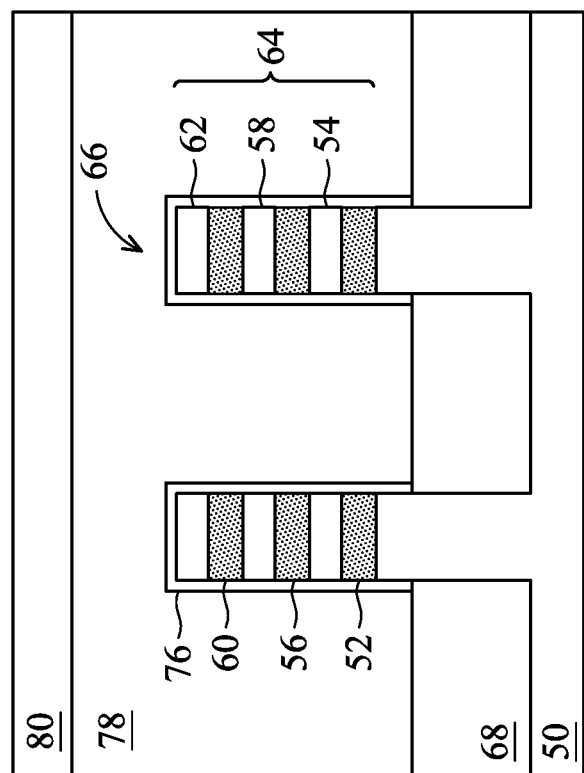

In FIGS. 9A and 9B, recesses 86 are formed in the fins 66. As illustrated in FIG. 8B, the recesses 86 extend through the third channel layer 62, the third sacrificial layer 60, the second channel layer 58, the second sacrificial layer 56, the first channel layer 54, and the first sacrificial layer 52, exposing the substrate 50. In some embodiments, recesses 86 extend partially through the substrate 50.

The recesses 86 may be formed by etching the fins 66 using anisotropic etching processes, such as reactive-ion etching (RIE), neutral beam etching (NBE), or the like. The gate spacers 85, the gate seal spacers 84, and the mask 80 mask portions of the fins 66 during the etching processes used to form the recesses 86. A single etch process may be used to etch each of the third channel layer 62, the third sacrificial layer 60, the second channel layer 58, the second sacrificial layer 56, the first channel layer 54, and the first sacrificial layer 52. In other embodiments, multiple etch processes may be used to etch the layers of the multi-layer stack 64.

In FIGS. 10A-10E, portions of the sidewalls of the layers of the multi-layer stack 64 exposed by the recesses 86 are etched to form sidewall recesses 88. The sidewalls may be etched using isotropic etching processes, such as wet etching or the like. The etchant may have a high selectivity for the second semiconductor material (e.g., SiGe) as compared to selectivity for the first semiconductor material (e.g., Si) or the materials comprising the gate seal spacers 84 and the gate spacers 85 (e.g., nitrides such as SiN and/or oxides). As illustrated in FIGS. 10B-10E, sidewalls of the third sacrificial layer 60, the second sacrificial layer 56, and the first sacrificial layer 52 may be predominantly etched. As further illustrated, frequently portions of sidewalls of the third channel layer 62, the second channel layer 58, and the first channel layer 54 may also be etched due to their proximity to the sacrificial layers.

The etchant may be chosen based on the semiconductor materials selected for each of the layers in the multi-layer stack 64. In some embodiments in which the first sacrificial layer 52, the second sacrificial layer 56, and the third sacrificial layer 60 comprise the second semiconductor material (e.g., SiGe) and the first channel layer 54, the second channel layer 58, and the third channel layer 62 comprise the first semiconductor material (e.g., Si or SiC), hydrofluoric acid (HF) solution, ozone (O3) solution, hydrogen peroxide (H$_2$O$_2$) solution, hydrochloric acid (HCl) solution, tetramethylammonium hydroxide (TMAH), ammonium hydroxide (NH$_4$OH), or the like may be used to etch sidewalls of the multi-layer stack 64, with a selectivity preference for etching the SiGe material. In other embodiments in which the semiconductor materials are reversed, diluted ammonium hydroxide-hydrogen peroxide mixture (APM), sulfuric acid-hydrogen peroxide mixture (SPM), or the like may be used to etch sidewalls of the multi-layer stack 64, with a selectivity preference for etching the Si or SiC material. In further embodiments, the layers may be etched using a dry etching process. Bromine-containing gas (e.g., HBr, CHBr$_3$, or a combination thereof), a fluorine-containing gases (e.g., HF, CF$_4$, SF$_6$, CH$_2$F$_2$, CHF$_3$, C$_2$F$_6$, or combinations thereof), oxygen-containing gas (e.g., O$_2$), a chlorine-containing gas (e.g., Cl$_2$), a helium-containing gas (e.g., He), and argon-containing gas (e.g., Ar), other suitable gases, or combinations thereof may be used to etch sidewalls of the multi-layer stack 64.

Figure 10A:
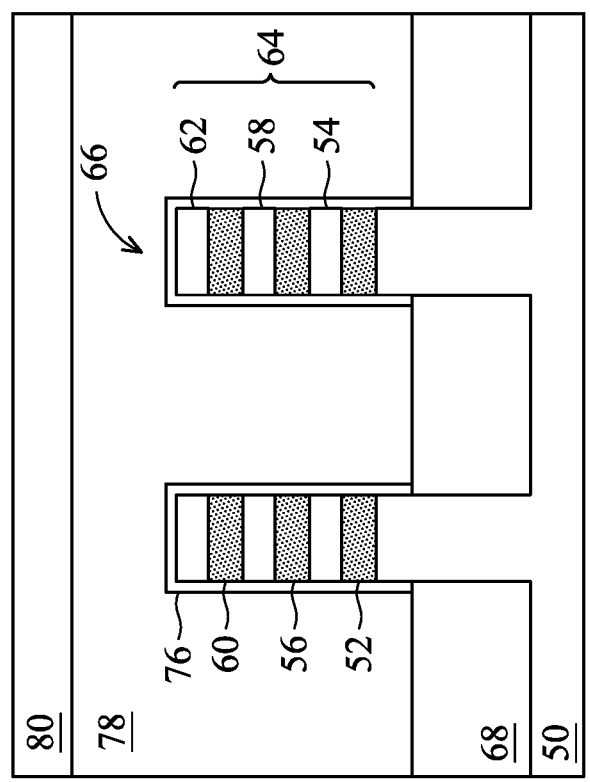
Figure 10C:
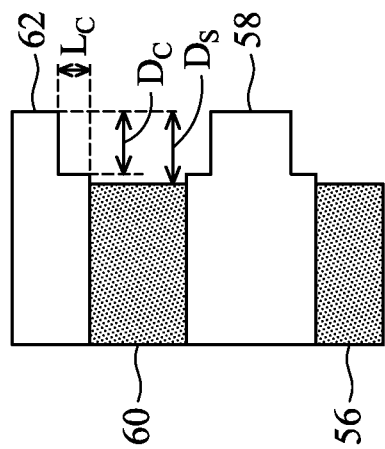
Figure 10B:
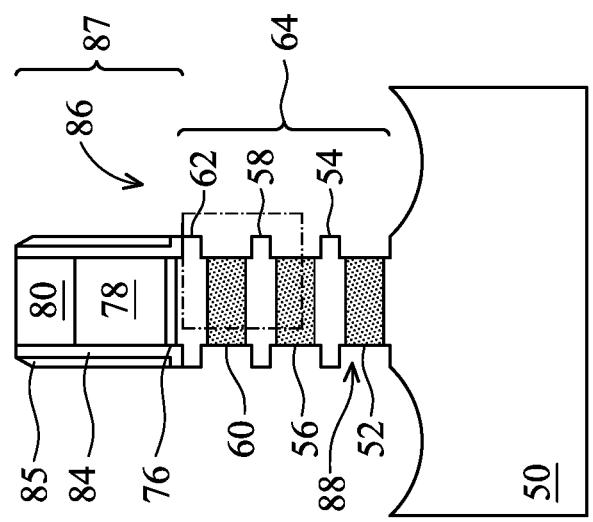

Referring to FIGS. 10B and 10C, the resulting sidewalls (including the sidewall recesses 88) of the layers of the multi-layer stack 64 may have a tooth-like shape. In some embodiments in which the etch selectivities are similar between the first semiconductor material (e.g., the channel layers) and the second semiconductor material (e.g., the sacrificial layers), the direction and precision of the anisotropic etching produces the main differences in etching the first semiconductor material versus the second semiconductor material. Although not specifically illustrated in FIG. 9B, the sidewalls of the sacrificial layers may have a concave shape caused by the direction and precision of the anisotropic etching.

Figure 10E:
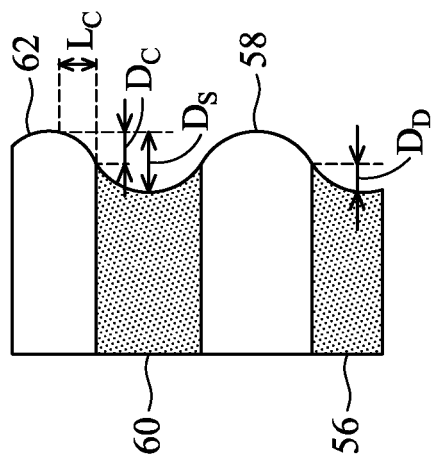
Figure 10D:
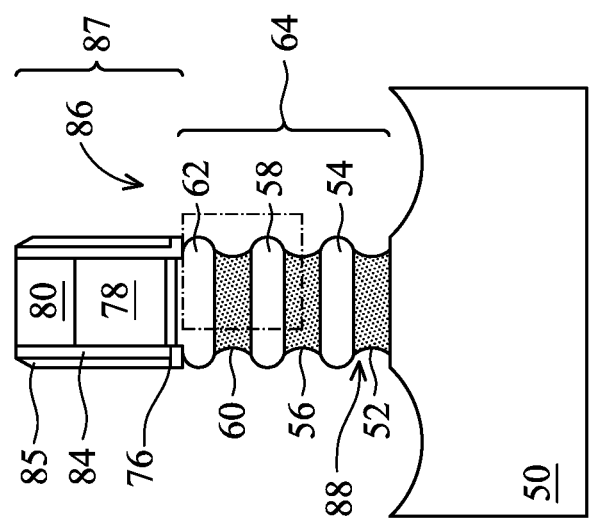

In another embodiment, referring to FIGS. 10D and 10E, the resulting sidewalls (including the sidewall recesses 88) of the layers of the multi-layer stack 64 may have a sinusoidal or wavy shape. In some embodiments, whether the etch selectivities are similar or different, a combination of the direction and precision of the anisotropic etching along with the differing etch selectivities may account for the sinusoidal shape. The illustrated concave shape is similar to the concave shape that may be exhibited (but not specifically illustrated) in the embodiments described above with respect to FIGS. 10B and 10C.

Referring to FIGS. 10B-10E, each of the sacrificial layers may have a depth Ds of the sidewall from its original from about 6 nm to about 9 nm, such as about 7 nm. In addition, each of the sacrificial layers may have a concave sidewall (illustrated in FIGS. 10D and 10E, while also applicable to FIGS. 10B and 10C) with a dishing depth $D_D$ from about 1 nm to about 3 nm, or about 2 nm. The etched portion of each of the channel layers may have a depth Dc of the sidewall from its original from about 1 nm to about 4 nm, such as about 3 nm. In addition, each of the channel layers may experience a tip loss $L_C$ in the vertical direction from about 0.5 nm to about 2 nm, such as about 1 nm.

Figure 11B:
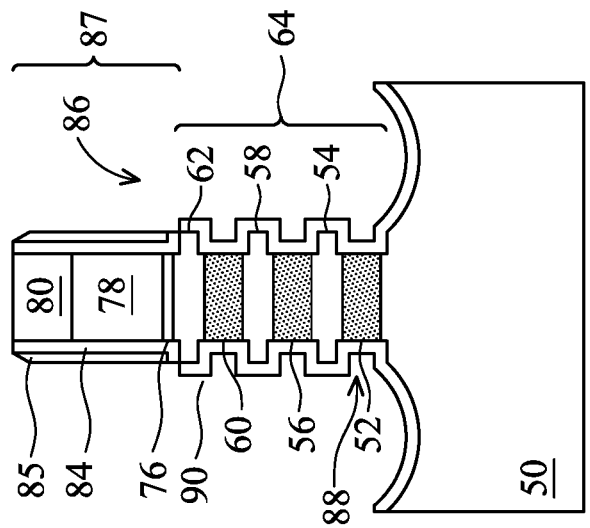
Figure 11A:
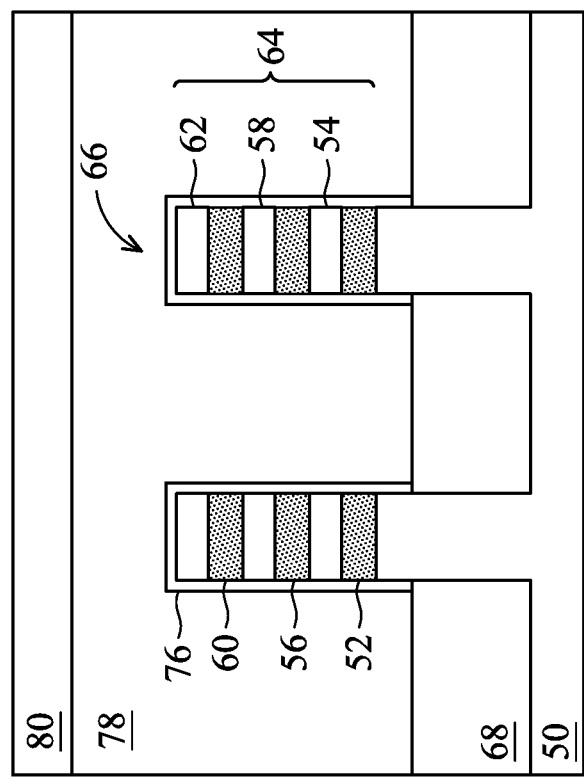
Figure 11C:
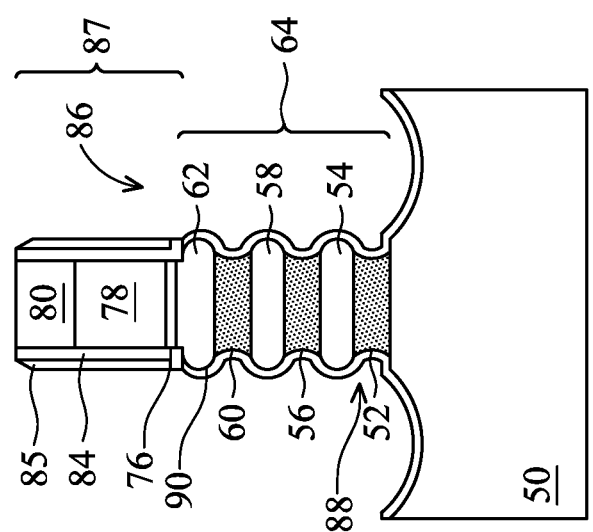

In FIGS. 11A-11C, semiconductor layer 90 is formed over the etched sidewalls of the layers of the multi-layer stack 64 and within the sidewall recesses 88. Note that FIG. 11B represents the embodiment from FIGS. 10A-10C, and FIG. 11C represents the embodiment from FIGS. 10A and 10D-10E. The semiconductor layer 90 may partially fill the sidewall recesses 88 and the recesses 86. Notably, the sidewall recesses 88 may be smaller in size due to the semiconductor layer 90 partially filling them. The semiconductor layer 90 may be epitaxially grown or conformally deposited over the sidewalls of the multi-layer stack 64 and over the substrate 50 using a process such as CVD, ALD, VPE, MBE, or the like. For example, the semiconductor layer 90 may be deposited with an epitaxial tool at a temperature of between about 400 and 800° C. A benefit of the epitaxial tool is that it may process wafers individually (or very few at a time) and, therefore, provide good uniformity on a wafer-to-wafer basis. Alternatively, the semiconductor layer 90 may be deposited with a furnace CVD tool at a temperature of between about 400 and 800° C. A benefit of the furnace CVD tool is it may process dozens of wafers at a time (such as, about 100 wafers) and, therefore, provide greater throughput. The semiconductor layer 90 may comprise silicon (Si), silicon carbon (SiC), silicon germanium (SiGe), or the like. In some embodiments, the semiconductor layer 90 comprises the same material as the channel layers of the multi-layer stack 64, such as the first semiconductor material. Due to the conformal formation, the semiconductor layer 90 may have similar contours as those described above with respect to FIGS. 10B-10E. The semiconductor layer 90 may have a thickness from about 1 nm to about 3 nm, such as about 2 nm.

Figure 12C:
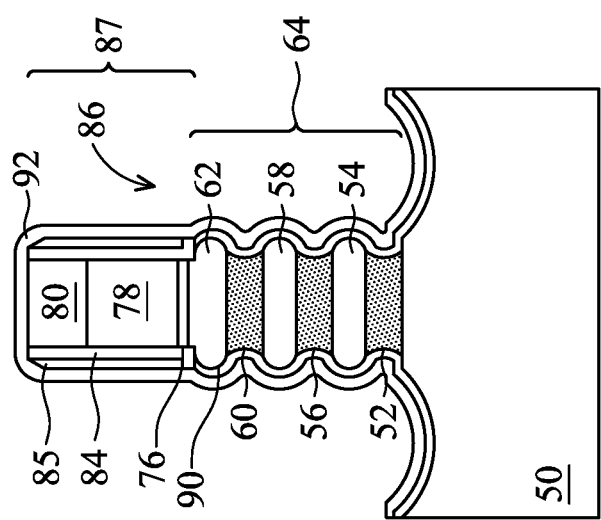

In FIGS. 12A-12C, inner spacer layer 92 is formed over the mask 80, the dummy gate 78, the sidewalls of the multi-layer stack 64, and the substrate 50. In addition, the inner spacer layer 92 may completely fill the sidewall recesses 88 and partially fill the recesses 86. The inner spacer layer 92 may be deposited by a conformal deposition process, such as CVD, ALD, or the like. The inner spacer layer 92 may comprise a material such as silicon nitride or silicon oxynitride, although any suitable material, such as low-k materials having a k-value less than about 3.5, may be utilized. The inner spacer layer 92 may have a thickness from about 3 nm to about 6 nm, such as about 4 nm.

Referring to FIG. 12B, the sidewall recesses 88 having a tooth-like shape are large enough for the inner spacer layer 92 to be deposited completely along the sidewalls of the multi-layer stack 64 while also small enough that the inner spacer layer 92 may not follow the tooth-like shape of the sidewalls of the multi-layer stack 64. Referring to FIG. 12C, the sidewall recesses 88 having a sinusoidal shape are large enough for the inner spacer layer 92 to be deposited completely along the sidewalls of the multi-layer stack 64 while also substantially following the contours of the sinusoidal shape of the sidewalls of the multi-layer stack 64.

Figure 13B:
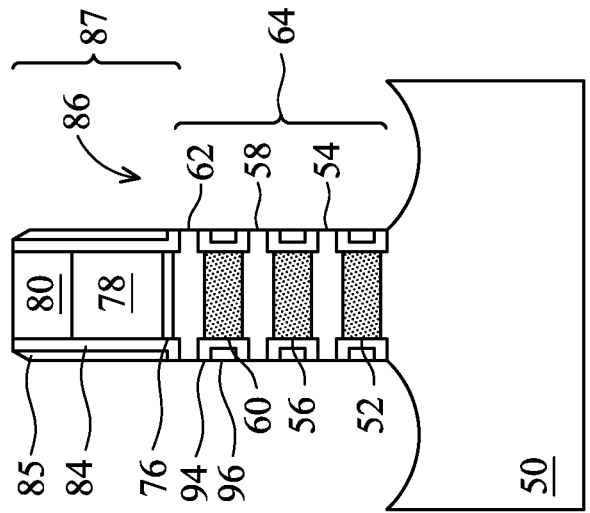
Figure 13A:
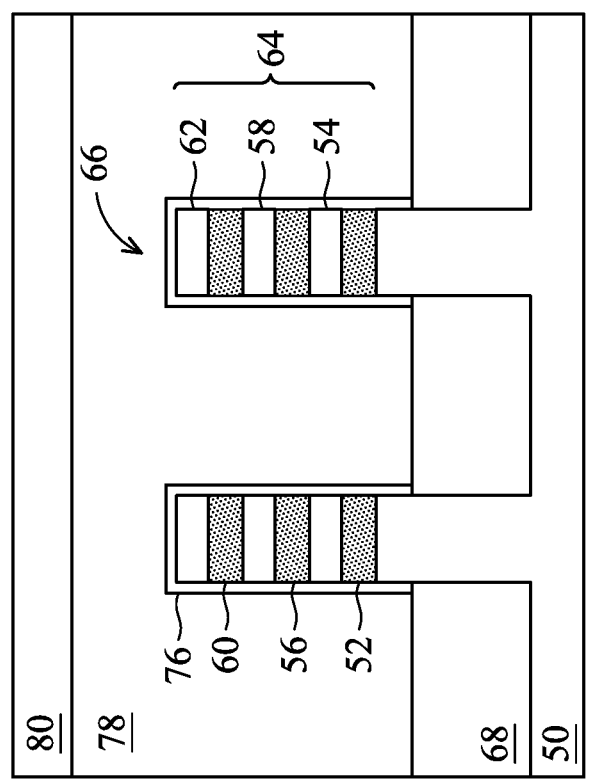
Figure 13C:
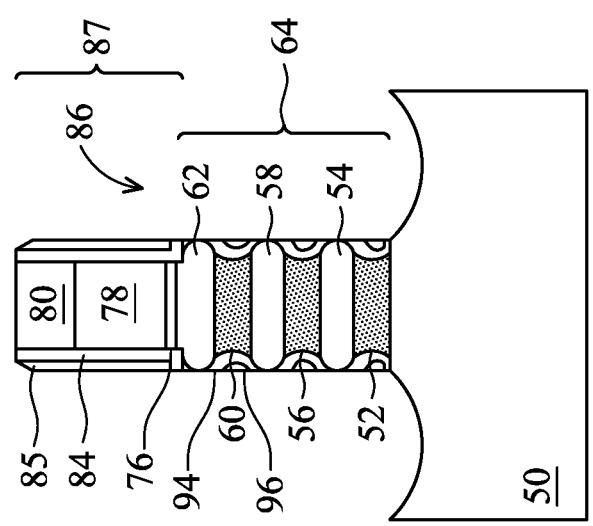

In FIGS. 13A-13C, the inner spacer layer 92 and the semiconductor layer 90 may then be etched to form inner spacers 96 and semiconductor regions 94. The inner spacer layer 92 may be etched by an anisotropic etching process, such as RIE, NBE, or the like. The etching process may remove portions of the inner spacer layer 92 from a top surface of the mask 80 and the recesses 86 in the substrate 50 as well as from top and side surfaces of the gate spacers 85 and the gate seal spacers 84. The inner spacers 96 may be used to prevent damage to subsequently formed source/drain regions (such as, the epitaxial source/drain regions 98 discussed below with respect to FIGS. 14A-14B) by subsequent etching processes. Although the inner spacers 96 are illustrated as having linear sidewalls, the sidewalls of the inner spacers 96 may be convex, concave, or the like. Moreover, the etching process may remove portions of the semiconductor layer 90 from the sidewalls of the multi-layer stack 64. In some embodiments, the etching process further removes portions of the semiconductor layer 90 from the recesses 86.

Referring to FIGS. 13B and 13C, the anisotropic etching may result in a relatively flat surface of the sidewalls of the multi-layer stack 64. As illustrated, the resulting sidewalls may comprise portions of the channel layers (e.g., 54, 58, 62), the semiconductor regions 94, and the inner spacers 96.

Referring to FIG. 13B, the inner spacers 96 may have a rectangular shape. Referring to FIG. 13C, the inner spacers 96 may have approximately a curved shape with a flat side, similar to a semicircular or circular segmental shape. Note that the subsequent figures will illustrate the FIG. 13B embodiment (i.e., the rectangular shape of the inner spacers 96), however, it should be appreciated that the subsequent process steps and figures may also apply to the FIG. 13C embodiment (i.e., the circular segmental shape of the inner spacers 96).

Figure 14B:
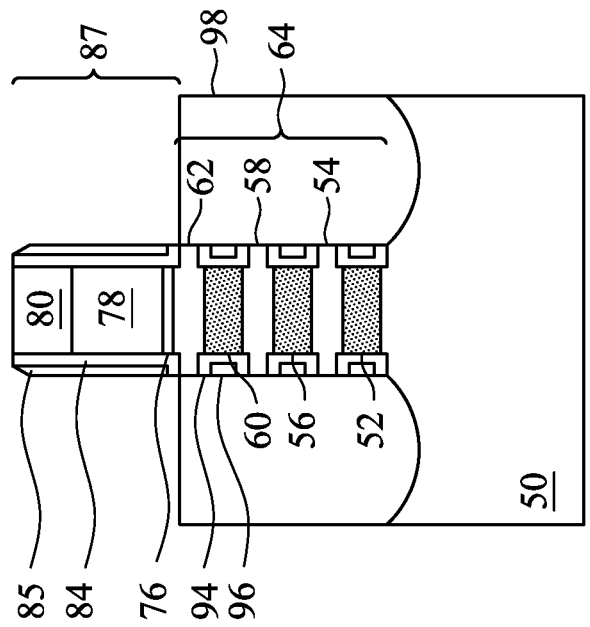
Figure 14A:
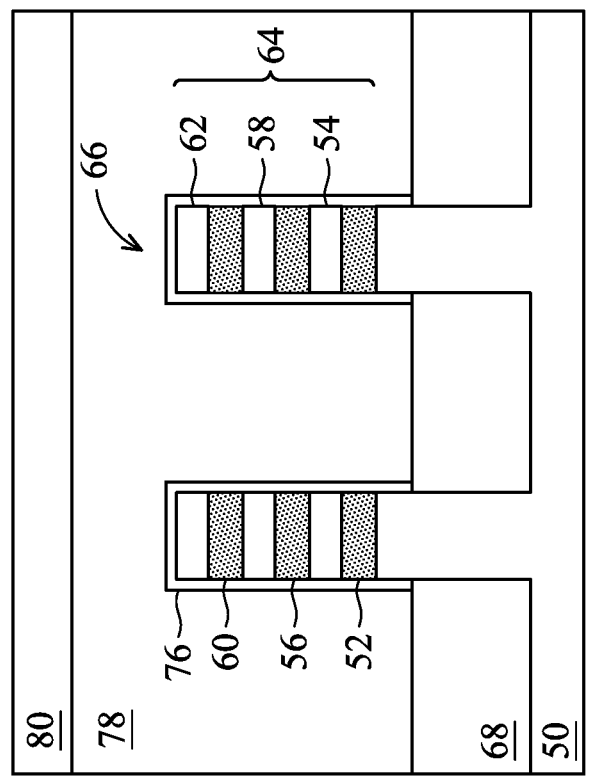
Figure 14C:
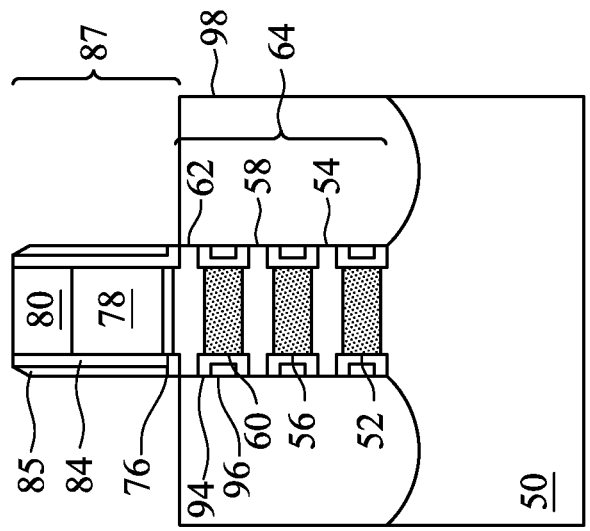
Figure 14D:
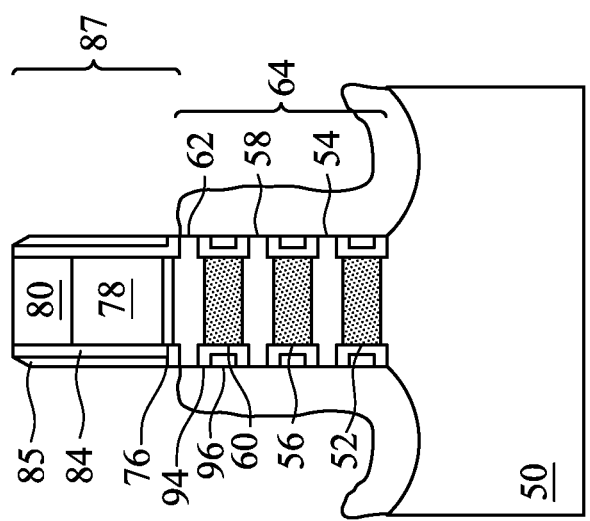
Figure 14E:
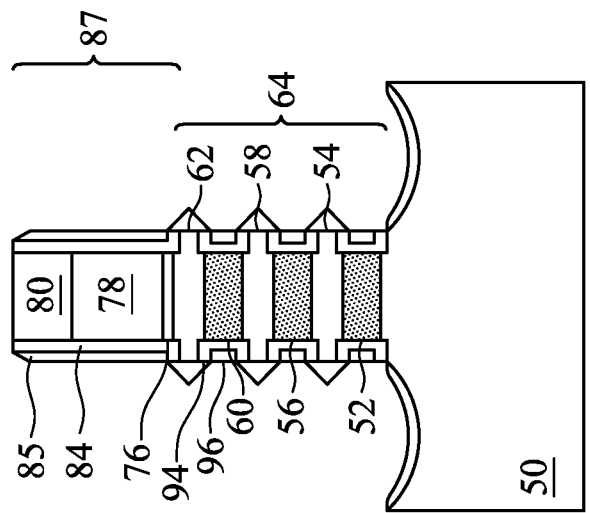

In FIGS. 14A-14E, epitaxial source/drain regions 98 are formed in the recesses 86 in to exert stress in the channel layers of the multi-layer stack 64, thereby improving performance. FIGS. 14A and 14B illustrate the result after forming the epitaxial source/drain regions 98, and FIGS. 14C-14E illustrate possible intermediary points in the formation process. The epitaxial source/drain regions 98 are formed on opposite sides of the dummy gate structure 87. Each of the first sacrificial layer 52, the second sacrificial layer 56, and the third sacrificial layer 60 extends laterally between the epitaxial source/drain regions 98. Each of the first channel layer 54, the second channel layer 58, and the third channel layer 62 also extends between the epitaxial source/drain regions 98 while also making contact with the epitaxial source/drain regions 98. In some embodiments, the gate spacers 85 and gate seal spacers 84 are used to separate the epitaxial source/drain regions 98 from the dummy gate structure 87 by an appropriate lateral distance so that the epitaxial source/drain regions 98 do not short out subsequently formed gates of the resulting nano-FETs. The inner spacers 96 may also be used to separate the epitaxial source/drain regions 98 from the dummy gate structure 87 and to prevent shorts between the epitaxial source/drain regions 98 and the subsequently formed gates of the resulting nano-FETs.

The epitaxial source/drain regions 98 may be epitaxially grown in the recesses 86. The epitaxial source/drain regions 98 may include any acceptable material, such as appropriate for n-type nano-FETs or p-type nano-FETs, whichever the case may be. For example, if the channel layers are silicon, the epitaxial source/drain regions 98 may include materials exerting a tensile strain in the channel layers, such as silicon, silicon carbide, phosphorous-doped silicon carbide, silicon phosphide, or the like. As an alternative example, if the channel layers are silicon-germanium, the epitaxial source/drain regions 98 may include materials exerting a compressive strain in the channel layers, such as silicon-germanium, boron-doped silicon-germanium, germanium, germanium-tin, or the like. In some embodiments, growth of the epitaxial source/drain regions 98 occurs more effectively directly from the surfaces of the sidewalls of the channel layers (i.e., first channel layer 54, second channel layer 58, third channel layer 62), the semiconductor regions 94, and the substrate 50 than from the surfaces of the sidewalls of the sacrificial layers (i.e., first sacrificial layer 52, second sacrificial layer 56, third sacrificial layer 60). In other words, the channel layers, the semiconductor regions 94, and the substrate 50 provide nucleation sites for the growth of the epitaxial source/drain regions 98. Although not specifically illustrated, the epitaxial source/drain regions 98 may have surfaces raised from respective surfaces of the multi-layer stack 64 and may have facets.

As a result of the epitaxy processes used to form the epitaxial source/drain regions 98, upper surfaces of the epitaxial source/drain regions 98 may have facets which expand laterally outward beyond sidewalls of the fins 66. In some embodiments, these facets cause adjacent epitaxial source/drain regions 98 of a same nano-FET to merge (not specifically illustrated). In other embodiments, adjacent epitaxial source/drain regions 98 may remain separated after the epitaxy process is completed (not specifically illustrated).

The epitaxial source/drain regions 98 may be implanted with dopants to form source/drain regions, similar to the process previously discussed for forming lightly-doped source/drain regions, followed by an anneal. The source/drain regions may have an impurity concentration from about $10^{19}$ atoms/cm$^3$ to about $10^{21}$ atoms/cm$^3$. The n-type and/or p-type impurities for source/drain regions may be any of the impurities previously discussed. In some embodiments, the epitaxial source/drain regions 98 may be in situ doped during growth.

Referring to FIGS. 14C-14E, the semiconductor regions 94 (formed and etched back as discussed above) improves the formation of the epitaxial source/drain regions 98. As a reminder, the over-etching described in FIGS. 10A-10C results in portions of the channel layers (i.e., first channel layer 54, second channel layer 58, third channel layer 62) near the sacrificial layers (i.e., first sacrificial layer 52, second sacrificial layer 56, third sacrificial layer 60) being removed from the anisotropic etching. The formation of the semiconductor regions 94, therefore, provides additional surface area, including nucleation sites, along the sidewalls of the multi-layer stack 64 that the epitaxial source/drain regions 98 with the type of material that the epitaxial source/drain regions 98 grow more effectively upon.

As illustrated in FIG. 14C, portions of the epitaxial source/drain regions 98 begin to form predominantly over the exposed surfaces and nucleation sites of the channel layers, the semiconductor regions 94, and the substrate. The greater surface area and number of nucleation sites allows the epitaxial source/drain regions 98 to begin growing at a faster rate. As illustrated in FIG. 14D, the portions of the epitaxial source/drain regions 98 merge with one another on each side of the multi-layer stack 64. The merging portions of the epitaxial source/drain regions 98 will also cover the inner spacers 96 even though the portions of the epitaxial source/drain regions 98 may not have initially begun growing over the inner spacers 96. The greater surface area and nucleation sites, as well as the faster initiation, results in greater uniformity when the portions of the epitaxial source/drain regions 98 merge with one another. As illustrated in FIG. 14E, the merged portions of the epitaxial source/drain regions 98 continue growing into the shape and form described above with respect to and identically illustrated in FIG. 14B. Due to the above-described benefits, the resulting epitaxial source/drain regions 98 will have greater uniformity and a lower number of defects throughout.

Figure 15B:
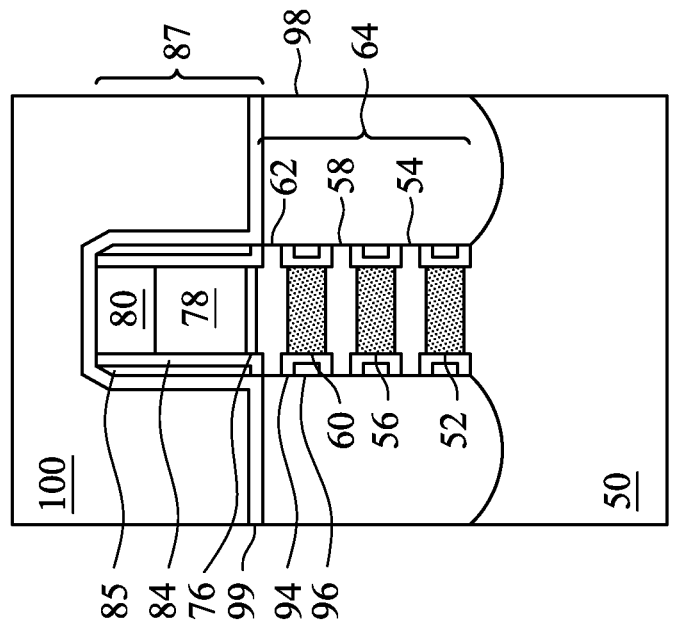
Figure 15A:
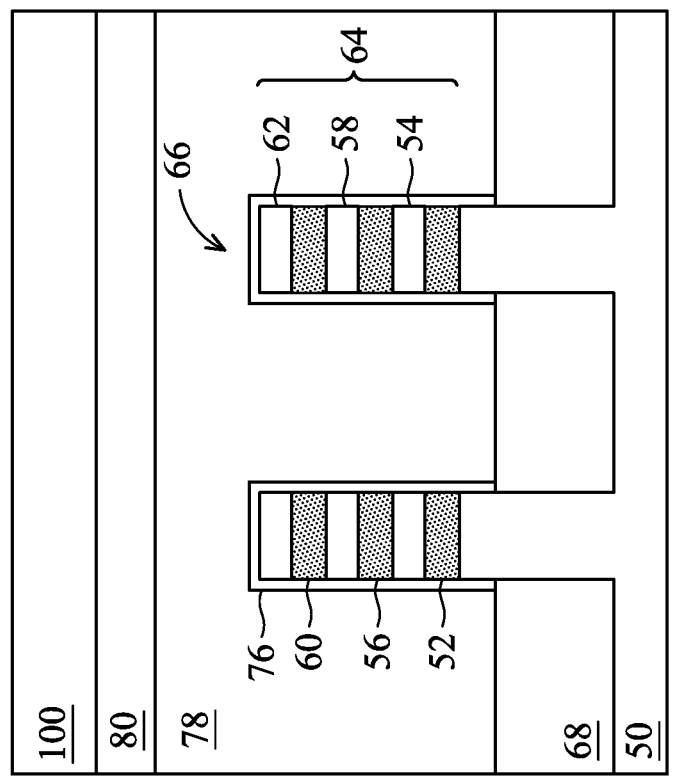

In FIGS. 15A and 15B, a first interlayer dielectric (ILD) 100 is deposited over the structure illustrated in FIGS. 12A and 12B. The first ILD 100 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 99 is disposed between the first ILD 100 and the epitaxial source/drain regions 98, the mask 80, and the gate spacers 85. The CESL 99 may comprise a dielectric material, such as, silicon nitride, silicon oxide, silicon oxynitride, or the like, having a different etch rate than the material of the overlying first ILD 100.

Figure 16B:
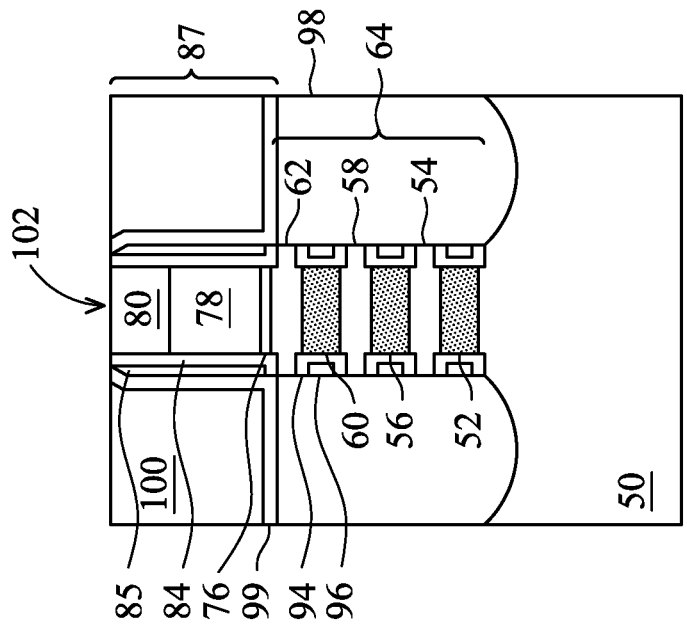
Figure 16A:
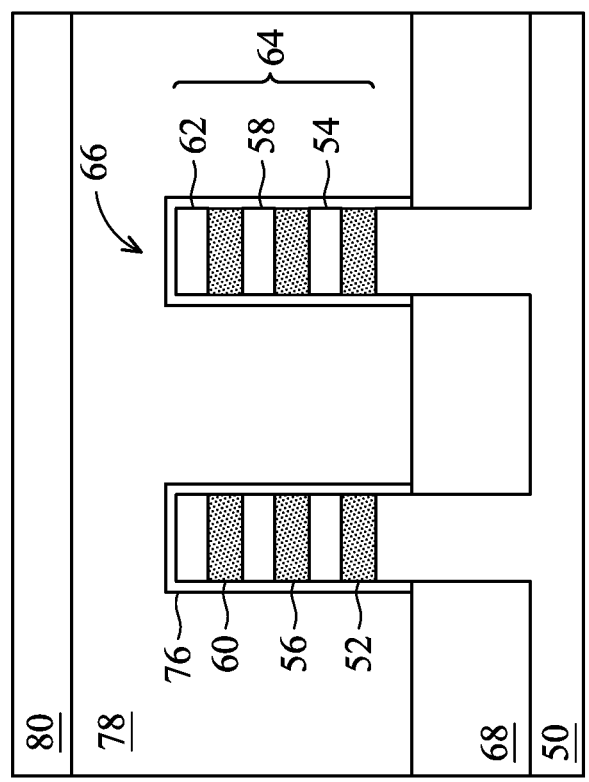

In FIGS. 16A and 16B, a planarization process, such as a CMP, may be performed to level the top surface of the first ILD 100 with the top surfaces of the dummy gate 78 or the mask 80. The planarization process may also remove a portion of the mask 80 on the dummy gate 78, and portions of the gate seal spacers 84 and the gate spacers 85 along sidewalls of the mask 80. Further, the planarization process may remove a portion of the CESL 99 above the mask 80 and along sidewalls of the gate spacers 85. After the planarization process, top surfaces of the dummy gate structure 87, the gate seal spacers 84, the gate spacers 85, the CESL 99, and the first ILD 100 are level. Accordingly, the top surface of the dummy gate 78 is exposed through the first ILD 100. In some embodiments, the mask 80 may remain, in which case the planarization process levels the top surface of the first ILD 100 with top surfaces of the masks 80, the gate seal spacers 84, and the gate spacers 85.

In FIGS. 17A and 17B, the dummy gate 78 and the mask 80, if present, are removed in an etching step(s), so that recess 102 is formed. Portions or all of the dummy dielectric layer 76 in the recesses 102 may also be removed. In some embodiments, only the dummy gate 78 is removed and the dummy dielectric layer 76 remains and is exposed by the recess 102. In some embodiments, the dummy dielectric layer 76 is removed from recesses 102 in a first region of a die (e.g., a core logic region) and remains in recesses 102 in a second region of the die (e.g., an input/output region). In some embodiments, the dummy gate 78 is removed by an anisotropic dry etch process. For example, the etching process may include a dry etch process using reaction gas(es) that selectively etch the dummy gate 78 without etching the first ILD 100, the gate seal spacers 84, or the gate spacers 85. The recess 102 exposes and/or overlies the multi-layer stack 64. Portions of the multi-layer stack 64 remain disposed between neighboring pairs of the epitaxial source/drain regions 98. During the removal, the dummy dielectric layer 76 may be used as an etch stop layer when the dummy gate 78 is etched. The dummy dielectric layer 76 may then be optionally removed after the removal of the dummy gate 78.

Figure 18B:
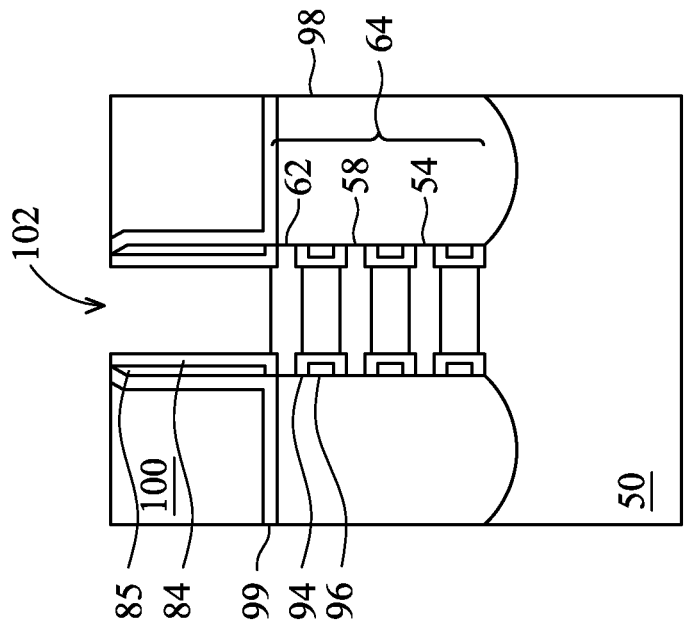
Figure 18A:
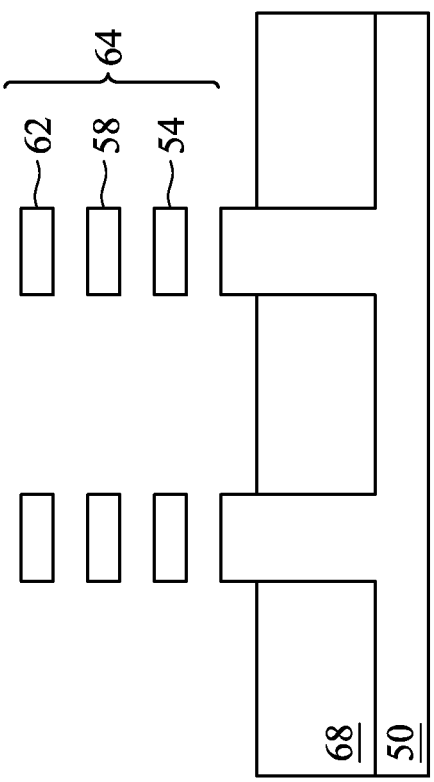

In FIGS. 18A and 18B, the first sacrificial layer 52, the second sacrificial layer 56, and the third sacrificial layer 60 are removed from the multi-layer stack 64, extending the recess 102. These layers of the multi-layer stack 64 may be removed by isotropic etching processes such as wet etching or the like. The etchants used to remove these layers may be selective to the material comprising these layers, such as the second semiconductor material. In some embodiments, in which the first sacrificial layer 52, the second sacrificial layer 56, and the third sacrificial layer 60 comprise the second semiconductor material (e.g., SiGe), hydrofluoric acid (HF) solution, ozone (03) solution, hydrogen peroxide ($H_2O_2$) solution, hydrochloric acid (HCl) solution, tetramethylammonium hydroxide (TMAH), ammonium hydroxide ($NH_4OH$), or the like may be used remove these layers of the multi-layer stack 64. In some embodiments, in which first sacrificial layer 52, the second sacrificial layer 56, and the third sacrificial layer 60 comprise the first semiconductor material (e.g., Si or SiC), diluted ammonium hydroxide-hydrogen peroxide mixture (APM), sulfuric acid-hydrogen peroxide mixture (SPM), or the like may be used to remove these layers of the multi-layer stack 64.

Figure 19B:
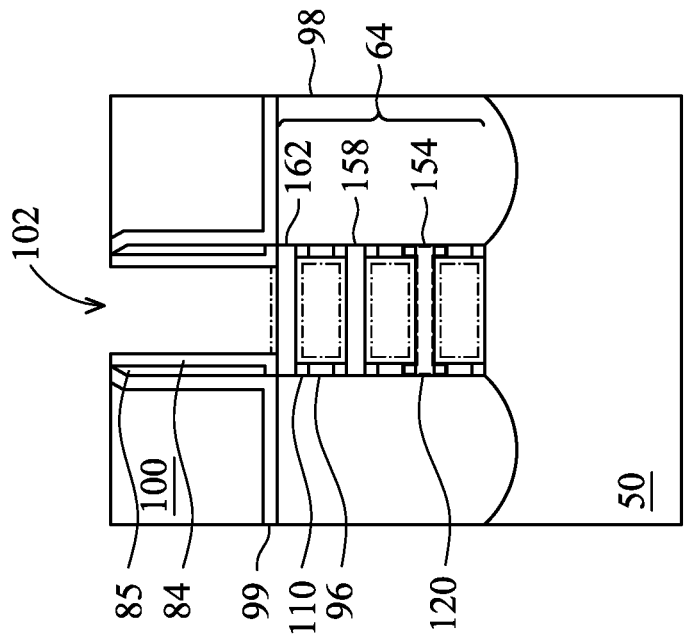
Figure 19A:
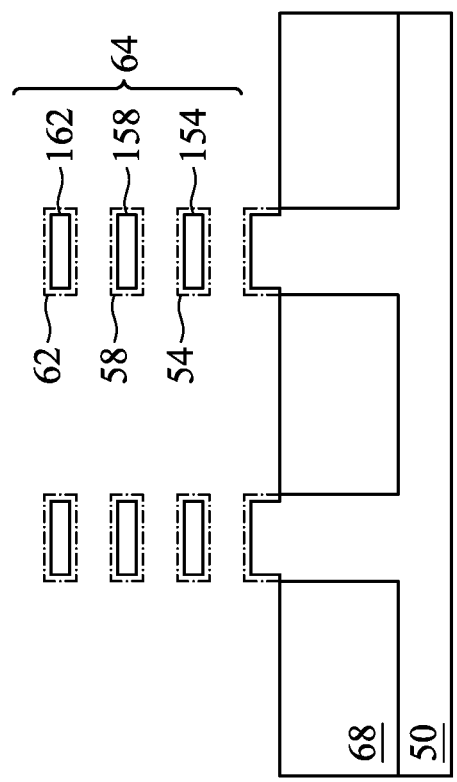
Figure 19C:
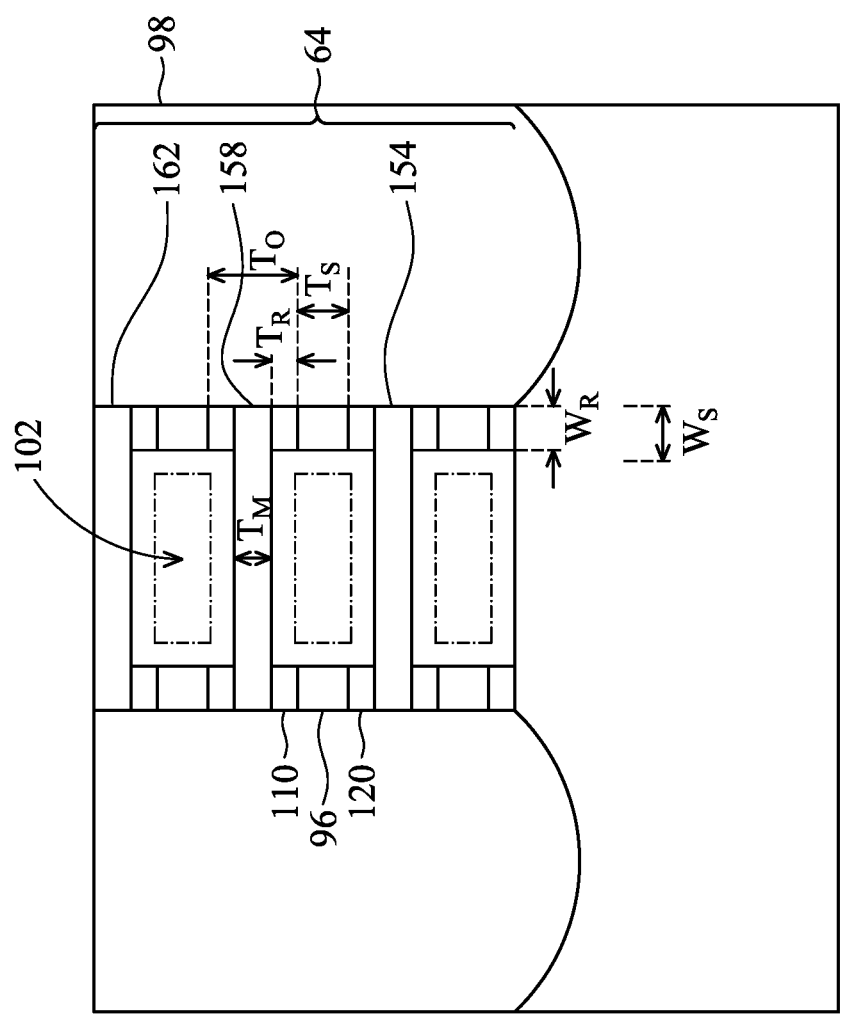

In FIGS. 19A-19C, after the first sacrificial layer 52, the second sacrificial layer 56, and the third sacrificial layer 60 have been removed by the isotropic etching process, the isotropic etching process may be continued to etch portions of the first channel layer 54, the second channel layer 58, the third channel layer 62, and the semiconductor regions 94. The continued isotropic etching, therefore, may extend the recess 102. As shown in the view of FIG. 19A, portions of each of the channel layers are etched around the perimeters, resulting in first etched channel layer 154, second etched channel layer 158, and third etched channel layer 162. For comparison, the dotted lines indicate the previous dimensions of the first channel layer 54, the second channel layer 58, and the third channel layer 62. As illustrated in FIGS. 19B and 19C, portions of each of the channel layers are simultaneously etched along their top, bottom, and side surfaces, while portions of the semiconductor regions 94 are etched along their side surfaces in outward directions toward the sidewalls of the multi-layer stack 64. For comparison, the dotted lines indicate the previous dimensions of the channel layers and the semiconductor regions 94. Notably, the dotted lines indicate a thickness change that may be about the thickness of the semiconductor layer 90 (formed in FIGS. 11A-11C), which is about 1 nm to about 3 nm, such as about 2 nm, because that is the amount of material that would need to be removed in order to expose the inner spacers 96. As further illustrated, portions of the substrate 50 may also be etched along the exposed top and upper sidewall surfaces. Similarly, the dotted lines indicate the previous dimensions of the substrate 50. The dotted lines around the substrate may indicate a thickness change that is about the same as that for the channel layers and the semiconductor regions 94 if the substrate 50 comprises a similar material or at least a material with a similar etch selectivity.

The continued isotropic etching may continue to until the recess 102 extends to the inner sidewalls of the inner spacers 96. As such, the continued isotropic etching removes all of the portions of the semiconductor regions 94 along the inner sidewalls of the inner spacers 96 leaving behind a plurality of semiconductor portions 110. The result is that each couple of the semiconductor portions 110 may be interposed by a corresponding inner spacer 96. A benefit of this is that the resulting nano-FET comprises distinct channel regions, which improves performance because the parallel nature of the separated channel regions will allow the current (between the epitaxial source/drain regions 98) to be more evenly distributed across the paths of the channel regions, with lower chances of a bulk of the current being funneled through a minority of the paths of the channel regions. In addition, regions of the extended recess 102 within the multi-layer stack 64 may be bordered by the etched channel layers (e.g., 154, 158, 162), the semiconductor portions 110, and the inner spacers 96.

Referring to FIG. 19C, a close-up of FIG. 19B is illustrated. An extended channel layer 120 is identified as comprising one of the etched channel layers (e.g., first etched channel layer 154, second etched channel layer 158, third etched channel layer 162) and up to four of the semiconductor portions 110—two above and two below. (Note that the topmost extended channel layer 120 may comprise only two of the semiconductor portions 110 below.) The extended channel layer forms a horizontal I-shape or I-beam shape in the views illustrated in FIGS. 19B and 19C, for example. The etched channel layer forms the main structure of the I-shape while each of the semiconductor portions 110 forms a stylistic serif ("stroke" or "line" or "dash") of the I-shape.

As a result of the continued etching, middle portions of the etched channel layers (or of the extended channel layer 120) may each have a thickness $T_M$ of about 5 nm to about 8 nm, such as about 6 nm. Note that thickness $T_M$ may be less than or equal to the thickness of each of the channel layers when initially deposited in connection with FIGS. 2A and 2B above. In addition, the semiconductor portions 110 may each have a thickness $T_R$ of about 1 nm to about 3 nm, such as about 2 nm. In some embodiments, thickness $T_R$ may be about the same as the thickness of the semiconductor layer 90 as initially deposited in connection with FIGS. 11A-11C above because these semiconductor portions 110 may have experienced lesser to none etching during the etching processes discussed above. As such, an outer portions of each of the etched channel layers will be sandwiched between the semiconductor portions 110 from above and below, providing a total outer thickness $T_O$ of about 8 nm to about 14 nm, such as about 10 nm. The inner spacers 96 may have a thickness $T_S$ of about 4 nm to about 9 nm, such as about 6 nm. Notably, where a particular inner spacer 96 interposes two remaining portions of the semiconductor regions 94, the thickness $T_S$ forms the distance between those two semiconductor portions 110.

The semiconductor portions 110 also have a width $W_R$ extending from the recess 102 to one of the epitaxial source/drain regions 98. The width $W_R$ is determined by the amount of etching to remove portions of the semiconductor regions 94 from the inner sidewalls of the inner spacers 96 to form the semiconductor portions 110. The width $W_R$ may be about 4 nm to about 8 nm, such as about 6 nm. The inner spacers 96 also have a width $W_S$ extending from the recess 102 to one of the epitaxial source/drain regions 98. The width $W_S$ may be about 3 nm to about 7 nm, such as about 5 nm. Note that the width $W_S$ of inner spacers 96 may be less than or equal to the thickness of the inner spacer layer 92 when initially deposited in connection with FIGS. 12A-12C. Also, it is worth noting that the width $W_R$ of the semiconductor portions 110 may be less than the width $W_S$ of the inner spacer due to slight over-etching to ensure that the inner sidewalls of the inner spacers 96 are sufficiently free of the material of the semiconductor portions 110.

In FIGS. 20A-21B, gate dielectric layer 176 and gate electrode 180 are formed as a replacement gate 187. The gate dielectric layer 176 is deposited conformally in the recess 102, such as on top surfaces, sidewalls, and bottom surfaces of the first etched channel layer 154, the second etched channel layer 158, and the third etched channel layer 162. The gate dielectric layer 176 may also be deposited on top surfaces of the substrate 50, the first ILD 100, the CESL 99, and the STI regions 68, on top surfaces, sidewalls, and bottom surfaces of the gate seal spacers 84, on top surfaces and bottom surfaces of the gate spacers 85, and on sidewalls of the inner spacers 96. In accordance with some embodiments, the gate dielectric layer 176 comprises silicon oxide, silicon nitride, or multilayers thereof. In some embodiments, the gate dielectric layer 176 includes a high-k dielectric material, and in these embodiments, the gate dielectric layer 176 may have a k value greater than about 7.0, and may include a metal oxide or a silicate of hafnium, aluminum, zirconium, lanthanum, manganese, barium, titanium, lead, and combinations thereof. The formation methods of the gate dielectric layer 176 may include molecular-beam deposition (MBD), ALD, PECVD, and the like. The gate dielectric layer 176 may have a thickness from about 1 nm to about 4 nm, such as about 2 nm.

Figure 20B:
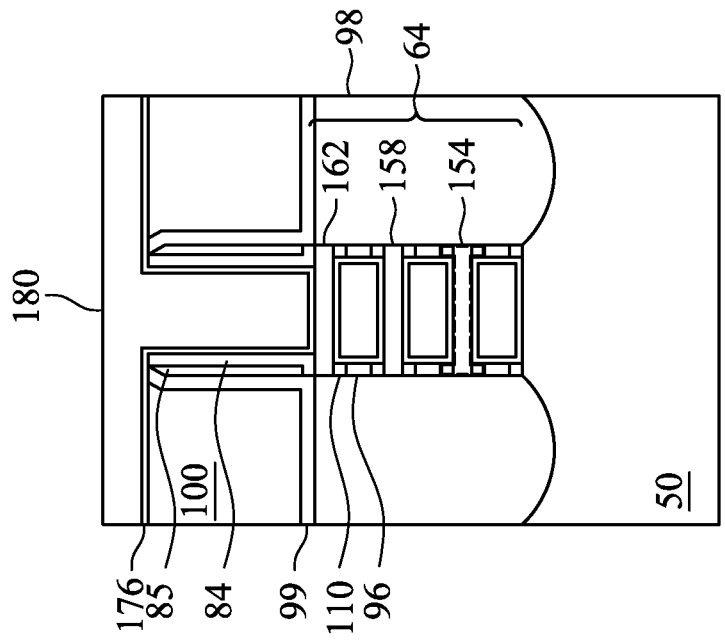
Figure 20A:
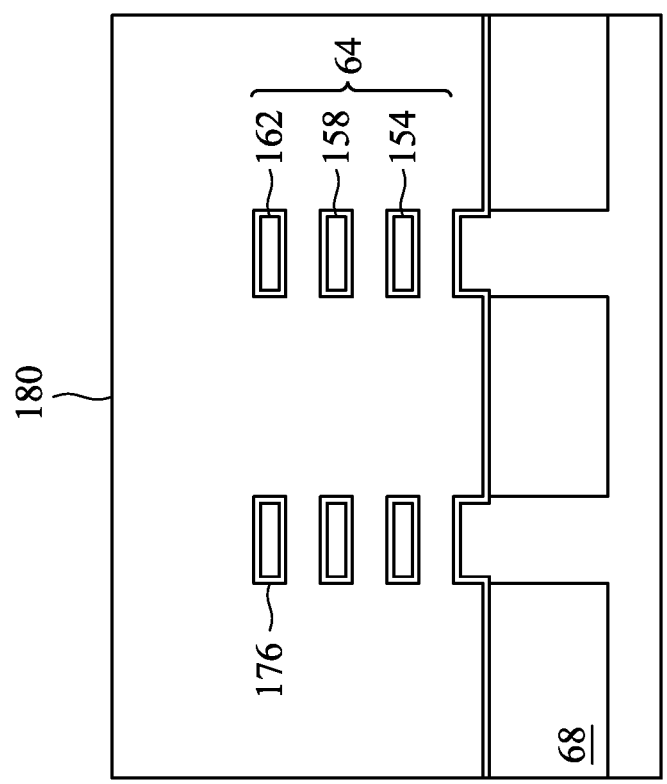

Referring to FIGS. 20A and 20B, the gate electrode 180 is deposited over the gate dielectric layer 176 and fills the remaining portions of the recess 102. The gate electrode 180 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 180 is illustrated in FIGS. 20A-

22B, the gate electrode 180 may comprise any number of liner layers, any number of work function tuning layers, and a fill material. Some or all of the layers making up the gate electrode 180 may extend between remaining portions of recess 102 extending between the substrate 50, the first etched channel layer 154, the second etched channel layer 158, and the third etched channel layer 162, depending on the thicknesses of the layers making up the gate electrode 180 and the spacing of those portions of the recess 102 interposed between the etched channel layers. The gate electrode 180 may be formed by ALD, CVD, PVD, the like, or combinations thereof. In some embodiments, the gate electrode 180 may be formed by ALD followed by PVD.

The formation of the gate dielectric layers 176 may occur simultaneously in regions containing both p-type and n-type nano-FETs, and the formation of the gate electrodes 180 may occur simultaneously such that the gate electrodes 180 in each region are formed from the same materials. In some embodiments, the gate dielectric layers 176 in each region may be formed by distinct processes, such that the gate dielectric layers 176 may be different materials in p-type nano-FETs as compared to n-type nano-FETs. Similarly, the gate electrodes 180 in each region may be formed by distinct processes, such that the gate electrodes 180 may be different materials in p-type nano-FETs as compared to n-type nano-FETs. Various masking steps may be used to mask and expose appropriate regions when using distinct processes.

Figure 21B:
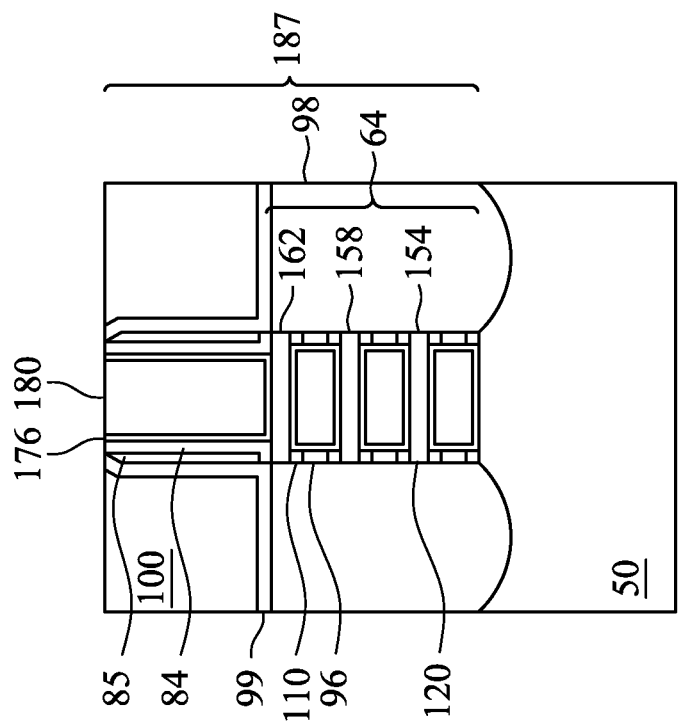
Figure 21A:
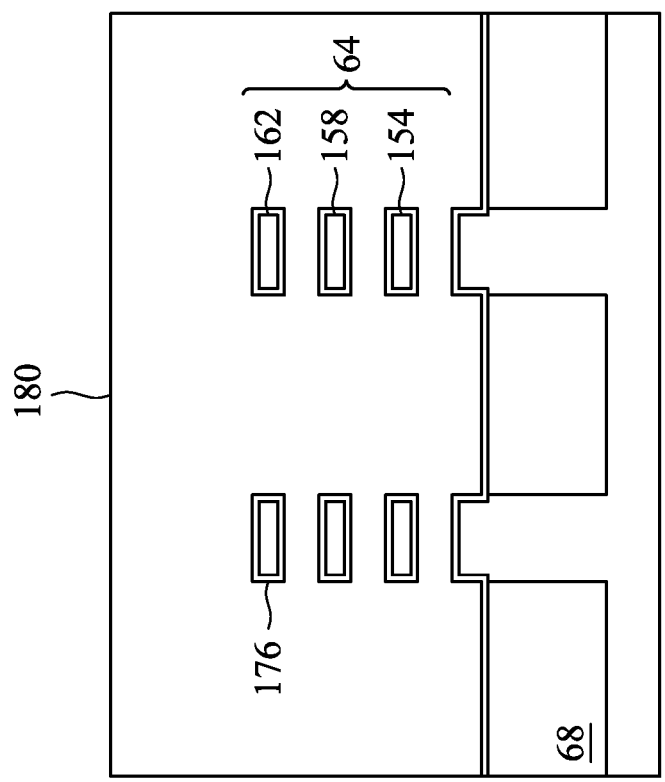

In FIGS. 21A and 21B, after the filling of the recess 102, a planarization process, such as a CMP, may be performed to remove the excess portions of the gate dielectric layer 176 and the material of the gate electrode 180, which excess portions are over the top surface of the first ILD 100. The remaining portions of material of the gate electrode 180 and the gate dielectric layer 176 thus form a replacement gate of the resulting nano-FET. The gate electrode 180 and the gate dielectric layer 176 may be collectively referred to as a "gate stack." The gate and the gate stack may surround each of the first etched channel layer 154, the second etched channel layer 158, and the third etched channel layer 162.

Figure 22B:
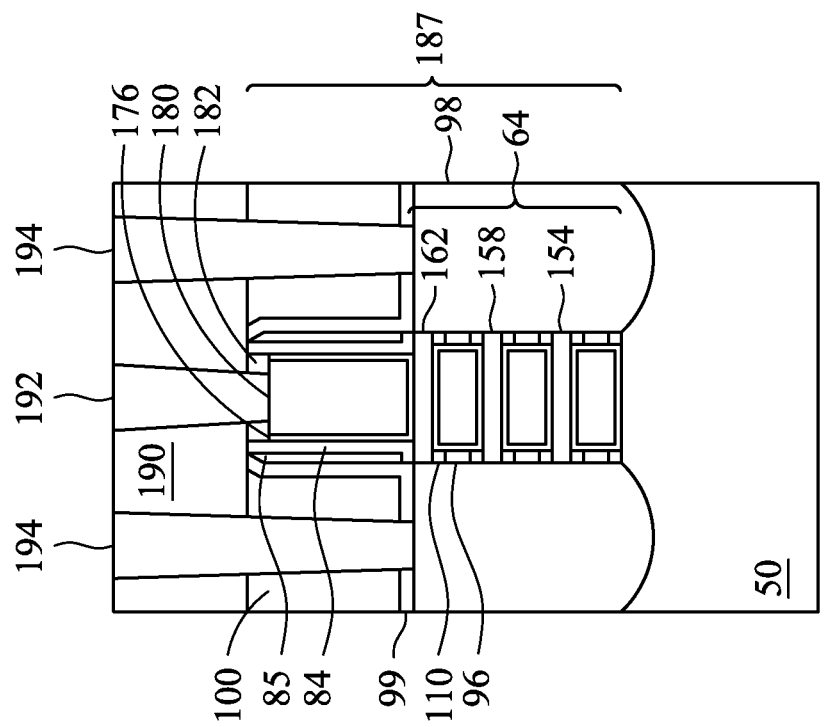
Figure 22A:
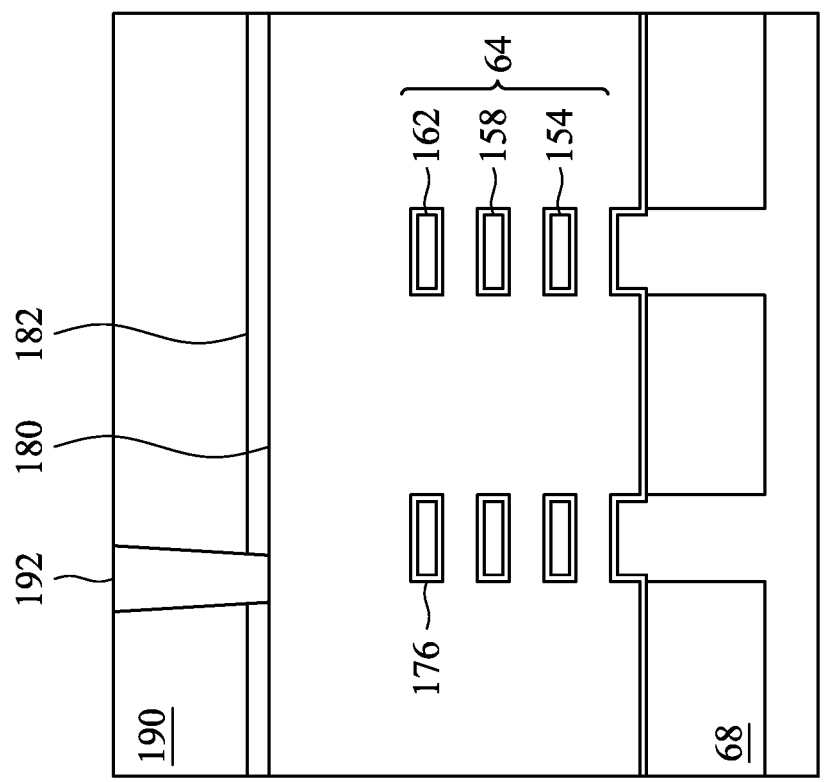

In FIGS. 22A and 22B, after the planarization process, a second ILD 190 may be deposited over the first ILD 100. In some embodiments, the second ILD is a flowable film formed by a flowable CVD method. In some embodiments, the second ILD 190 is formed of a dielectric material such as PSG, BSG, BPSG, USG, or the like, and may be deposited by any suitable method, such as CVD, PECVD, or the like. In accordance with some embodiments, before the formation of the second ILD, the gate stack (including the gate dielectric layers 176 and the corresponding overlying gate electrode 180) is recessed, so that a recess is formed directly over the gate stack and between opposing portions of gate seal spacers 84. A gate mask 182 comprising one or more layers of dielectric material, such as silicon nitride, silicon oxynitride, or the like, is filled in the recess, followed by a planarization process to remove excess portions of the dielectric material extending over the first ILD 100. Subsequently formed gate contacts 192 penetrate through the second ILD 190 and the gate mask 182 to contact the top surface of the recessed gate electrode 180. In addition, source/drain contacts 194 penetrate through the second ILD 190, the first ILD 100, and the CESL 99 to contact top surfaces of the epitaxial source/drain regions 98.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The process of forming a nano-FET is improved regardless of whether the lateral etch of the sacrificial layers includes some degree of lateral etching of the channel layers, whether intended or not. Notably, the semiconductor layer formed over the sides ultimately provides a larger surface area to facilitate subsequent formation of the epitaxial source/drain regions. The epitaxial source/drain regions will therefore form more quickly and with fewer defects. In addition, the increased surface area between the semiconductor layer (which is etched to form outer portions of the channel regions) and the epitaxial source/drain regions improves the performance and reliability of the nano-FET by lowering resistance for current to flow across the boundaries.

In an embodiment, forming a semiconductor device includes forming a semiconductor stack comprising a first semiconductor layer and a second semiconductor layer and etching the semiconductor stack to form a fin comprising nanostructures. A dummy gate structure is formed over the fin and recesses are etched through the fins to expose an underlying semiconductor substrate as well as side portions of the first and second semiconductor layers. A lateral etch then removes portions of the side portions of the first and second semiconductor layers. A third semiconductor layer is formed over those etched exposed side portions of the first and second semiconductor layers. A dielectric layer is then formed over the third semiconductor layer, and both are etched to expose portions of the third semiconductor layer. An epitaxial region is then formed over the substrate and the exposed portions of the third semiconductor layer. Portions of the dummy gate structure are removed, which then allows for removal of remaining portions of the first semiconductor layer to form an opening. A gate structure can then be formed in the opening.

In another embodiment, a semiconductor device includes a gate structure extending along a first plane. The gate structure includes a gate dielectric layer and a conductive material. The semiconductor device further includes a source region and a drain region on opposing sides of the gate structure in a second plane (perpendicular to the first plane) but not in the first plane. The semiconductor device further includes a first nanostructure extending between the source region and the drain region, such that in the second plane the first nanostructure has a shape of a horizontal I with serifs, and such that the gate dielectric layer wraps around a middle portion of the first nanostructure and the conductive material wraps around the gate dielectric layer.

In yet another embodiment, a semiconductor device includes a first nanostructure, a second nanostructure, an inner spacer, and a gate stack. The first nanostructure extends from a first epitaxial region to a second epitaxial region and includes a first semiconductor layer, a second semiconductor layer over the first semiconductor layer, and a third semiconductor layer over the second semiconductor layer. Similarly, the second nanostructure extends from the first epitaxial region to the second epitaxial region and includes a fourth semiconductor layer, a fifth semiconductor layer over the fourth semiconductor layer, and a sixth semiconductor layer over the fifth semiconductor layer. The inner spacer directly interposes the third and the fourth semiconductor layers. The gate stack includes a gate dielectric layer and a gate electrode and interposes the first nanostructure and the second nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure extending along a first plane, the gate structure comprising a gate dielectric layer and a conductive material;
   a source region and a drain region on opposing sides of the gate structure in a second plane, the second plane being perpendicular to the first plane, neither of the source region and the drain region being in the first plane;
   a first nanostructure extending between the source region and the drain region, in the second plane, the first nanostructure having a C-shape with first protrusions, the gate dielectric layer wrapping around a middle portion of the first nanostructure, the conductive material wrapped around the gate dielectric layer, the gate dielectric layer being in physical contact with the first protrusions of the C-shape; and
   a semiconductor substrate extending between the source region and the drain region, the semiconductor substrate vertically displaced from the first nanostructure by a portion of the gate structure, the semiconductor substrate comprising second protrusions extending toward the first protrusions of the first nanostructure, the first protrusions of the C-shape extending from a lower surface of the first nanostructure toward a semiconductor substrate, an upper surface of the first nanostructure being substantially free of protrusions, the upper surface facing opposite of the lower surface.

2. The semiconductor device of claim 1, further comprising a second nanostructure below the first nanostructure, the gate dielectric layer and the conductive material interposing the first nanostructure and the second nanostructure.

3. The semiconductor device of claim 2, wherein the second nanostructure has an I-shape with serifs.

4. The semiconductor device of claim 3, further comprising an inner spacer, the inner spacer directly interposing one of the first protrusions of the first nanostructure and one of the serifs of the second nanostructure.

5. The semiconductor device of claim 4, wherein the gate dielectric layer physically contacts the inner spacer.

6. The semiconductor device of claim 1, wherein:
   in the second plane the gate dielectric layer forming a first ring around the conductive material; and
   in the first plane the conductive material forming a second ring around the gate dielectric layer.

7. The semiconductor device of claim 1, wherein the gate dielectric layer comprises a high-k dielectric material.

8. A semiconductor device, comprising:
   a first nanostructure extending between a first epitaxial region and a second epitaxial region, the first nanostructure comprising:
      a first semiconductor layer;
      a second semiconductor layer disposed on the first semiconductor layer; and
      a third semiconductor layer disposed on the second semiconductor layer;
   a second nanostructure disposed over the first nanostructure, the second nanostructure extending from the first epitaxial region to the second epitaxial region, the second nanostructure comprising:
      a fourth semiconductor layer; and
      a fifth semiconductor layer disposed on the fourth semiconductor layer, a lower surface of the fifth semiconductor layer being in physical contact with the fourth semiconductor layer, an entirety of an upper surface of the fifth semiconductor layer being in physical contact with dielectric material, and the upper surface facing opposite of the lower surface;
   an inner spacer directly interposed between the third semiconductor layer and the fourth semiconductor layer; and
   a gate stack interposed between the first nanostructure and the second nanostructure, the gate stack comprising a gate dielectric layer and a gate electrode, the gate dielectric layer being in physical contact with the second semiconductor layer, the third semiconductor layer, the fourth semiconductor layer, and the fifth semiconductor layer.

9. The semiconductor device of claim 8, wherein the first epitaxial region is in physical contact with the first nanostructure, the second nanostructure, and the inner spacer.

10. The semiconductor device of claim 9, wherein the first epitaxial region is in physical contact with the first semiconductor layer, the second semiconductor layer, the third semiconductor layer, the fourth semiconductor layer, and the fifth semiconductor layer.

11. The semiconductor device of claim 8, wherein the inner spacer is directly interposed between the first epitaxial region and the gate dielectric layer.

12. The semiconductor device of claim 8, wherein the third semiconductor layer, the inner spacer, and the fourth semiconductor layer are level on a first sidewall and a second sidewall, the first sidewall being opposite the second sidewall.

13. A semiconductor device, comprising:
   a first channel region extending between a first source/drain region and a second source/drain region, wherein in a cross-section the first channel region has a first I-shape;
   a second channel region extending between the first source/drain region and the second source/drain region, wherein a width of a portion of the first channel region along the first source/drain region is greater than a width of a portion of the second channel region along the first source/drain region, wherein in the cross-section the second channel region has a second I-shape, and wherein the second I-shape comprises fewer serifs than the first I-shape;
   a first inner spacer directly interposed between the first channel region and the second channel region, the first inner spacer being directly adjacent to the first source/drain region;
   a second inner spacer directly interposed between the first channel region and the second channel region, the second inner spacer being directly adjacent to the second source/drain region;
a gate dielectric layer having a ring shape, the ring shape being bound by surfaces of the first channel region, the second channel region, the first inner spacer, and the second inner spacer; and
a gate electrode disposed within the ring shape of the gate dielectric layer, the gate electrode having a diameter extending perpendicular to the first channel region and the second channel region, wherein the diameter is greater than a length of the first inner spacer extending from the first channel region to the second channel region.

14. The semiconductor device of claim 13, wherein the gate dielectric layer comprises a first portion wrapped around the first channel region and a second portion wrapped around the second channel region.

15. The semiconductor device of claim 14, wherein the first portion and the second portion are continuous.

16. The semiconductor device of claim 13, wherein the first I-shape comprises four serifs.

17. The semiconductor device of claim 16, wherein the second I-shape comprises a first side with serifs and a second side that is free of serifs, and wherein the second side faces opposite to the first side.

18. The semiconductor device of claim 13, wherein the first channel region comprises a first semiconductor layer extending from the first source/drain region to the second source/drain region, and wherein the first channel region further comprises a second semiconductor layer extending from the first semiconductor layer to the first inner spacer.

19. The semiconductor device of claim 13, further comprising a gate spacer disposed over and physically contacting the second channel region.

20. The semiconductor device of claim 13, wherein the first I-shape comprises four serifs, and wherein the second I-shape comprises fewer serifs than the first I-shape due to presence of one or more gate spacers.

* * * * *